United States Patent
Nagasaka

(10) Patent No.: US 8,004,651 B2
(45) Date of Patent: Aug. 23, 2011

(54) LIQUID RECOVERY SYSTEM, IMMERSION EXPOSURE APPARATUS, IMMERSION EXPOSING METHOD, AND DEVICE FABRICATING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 641 days.

(21) Appl. No.: 12/010,162

(22) Filed: Jan. 22, 2008

(65) Prior Publication Data

US 2008/0174748 A1 Jul. 24, 2008

Related U.S. Application Data

(60) Provisional application No. 60/881,826, filed on Jan. 23, 2007.

(51) Int. Cl.
*G03B 27/42* (2006.01)
*G03B 27/52* (2006.01)

(52) U.S. Cl. ............................................. 355/53; 355/30

(58) Field of Classification Search .................... 355/30, 355/53; 250/548
See application file for complete search history.

(56) References Cited

U.S. PATENT DOCUMENTS

| | | |
|---|---|---|
| 6,208,407 B1 | 3/2001 | Loopstra |
| 6,262,796 B1 | 7/2001 | Loopstra et al. |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,611,316 B2 | 8/2003 | Sewell |
| 6,778,257 B2 | 8/2004 | Bleeker et al. |
| 6,867,844 B2 | 3/2005 | Vogel et al. |
| 6,897,963 B1 | 5/2005 | Taniguchi et al. |
| 7,023,610 B2 | 4/2006 | Ohtsuki et al. |
| 7,292,313 B2 | 11/2007 | Poon et al. |
| 2006/0087630 A1 | 4/2006 | Kemper et al. |
| 2006/0221315 A1 | 10/2006 | Beckers et al. |
| 2006/0231206 A1 | 10/2006 | Nagasaka et al. |
| 2007/0110213 A1 | 5/2007 | Leenders et al. |
| 2007/0222959 A1 | 9/2007 | Nagasaka et al. |
| 2008/0068567 A1* | 3/2008 | Nagasaka et al. ............... 355/30 |

FOREIGN PATENT DOCUMENTS

| | | |
|---|---|---|
| EP | 1 703 548 A1 | 9/2006 |
| EP | 1 768 170 A1 | 3/2007 |
| EP | 1 863 070 A | 12/2007 |
| JP | A-10-163099 | 6/1998 |
| JP | A-10-214783 | 8/1998 |

(Continued)

OTHER PUBLICATIONS

Sep. 15, 2008 International Search Report for PCT/JP2008/051328.

(Continued)

*Primary Examiner* — Hung Henry Nguyen
(74) *Attorney, Agent, or Firm* — Oliff & Berridge, PLC

(57) ABSTRACT

A liquid recovery system is used by an immersion exposure apparatus. The liquid recovery system is provided with a first opening; a gap portion that is provided so that a liquid on an object that opposes the first opening can flow into the gap portion through the first opening; a liquid recovery part that suctions, through a porous member, at least part of the liquid that flows into the gap portion; and a second opening that is different from the first opening. The gap portion is open to the atmosphere through the second opening.

37 Claims, 14 Drawing Sheets

FOREIGN PATENT DOCUMENTS

| | | |
|---|---|---|
| JP | A-11-135400 | 5/1999 |
| JP | A-2000-505958 | 5/2000 |
| JP | A-2000-164504 | 6/2000 |
| JP | A-2004-519850 | 7/2004 |
| WO | WO 98/28665 | 7/1998 |
| WO | WO 99/46835 | 9/1999 |
| WO | WO 99/49504 A1 | 9/1999 |
| WO | WO 01/35168 A1 | 5/2001 |
| WO | WO 02/069049 A2 | 9/2002 |
| WO | WO 2004/019128 A2 | 3/2004 |
| WO | WO 2004/092833 A2 | 10/2004 |
| WO | WO 2005/024517 A2 | 3/2005 |
| WO | WO 2005/059617 A2 | 6/2005 |
| WO | WO 2005/059618 A2 | 6/2005 |
| WO | WO 2005/067013 A1 | 7/2005 |
| WO | WO 2005/122221 A1 | 12/2005 |
| WO | WO 2006/080516 A1 | 8/2006 |

OTHER PUBLICATIONS

Sep. 15, 2008 Written Opinion of the International Searching Authority for PCT/JP2008/051328.

Sep. 3, 2010 Chinese Office Action for Chinese Patent Application No. 200880002821.1 (with translation).

* cited by examiner

LIQUID RECOVERY SYSTEM, IMMERSION EXPOSURE APPARATUS, IMMERSION EXPOSING METHOD, AND DEVICE FABRICATING METHOD

CROSS-REFERENCE TO RELATED APPLICATION

This application is non-provisional application claiming benefit of provisional application No. 60/881,826, filed Jan. 23, 2007, the contents of which are incorporated herein by reference.

BACKGROUND

1. Field of the Invention

The present invention relates to a liquid recovery system, an immersion exposure apparatus that uses such, an immersion exposing method, and a device fabricating method.

2. Description of Related Art

Among exposure apparatuses used in a photolithographic process, an immersion exposure apparatus is known that exposes a substrate through a liquid, as disclosed in the PCT International Publication WO99/49504.

With exposure apparatuses, there is a demand to increase the moving speed of substrates. In an immersion exposure apparatus, liquid is both supplied to and recovered from an optical path of exposure light. If the moving speed of a substrate is increased, then there is a possibility that the liquid will not be completely recovered, or that it will leak or remain on the substrate. If such problems arise, then there is a possibility that exposure failures will occur, leading to, for example, defects in the pattern formed on the substrate. As a result, there is a possibility mat defective devices will be fabricated.

A purpose of some aspects of the invention is to provide a liquid recovery system that can recover a liquid satisfactorily. Another purpose is to provide an immersion exposure apparatus and an immersion exposing method that can recover the liquid satisfactorily and thereby prevent the occurrence of exposure failures. Yet another purpose is to provide a device fabricating method that can prevent the production of defective devices.

SUMMARY

A first aspect of the invention provides a liquid recovery system that is used by an immersion exposure apparatus and comprises: a first opening; a gap portion into which, through the first opening, a liquid on an object that opposes the first opening can flow; a liquid recovery part that suctions, through a porous member, at least part of the liquid that flows into the gap portion; and a second opening that is different from the first opening; wherein, the gap portion is open to the atmosphere through the second opening.

According to the first aspect of the invention, it is possible to recover the liquid satisfactorily.

A second aspect of the invention provides an immersion exposure apparatus that exposes a substrate and comprises: an optical member, which comprises an emergent surface that emits exposure light; and a liquid recovery system that comprises: a first opening; a second opening that is different from the first opening; a gap portion into which, through the first opening, a liquid on an object that opposes the first opening can flow; and a liquid recovery part that suctions, through a porous member, at least part of the liquid that flows into the gap portion; wherein, the gap portion is open to the atmosphere through the second opening.

According to the second aspect of the invention, it is possible to recover the liquid satisfactorily, and thereby to prevent exposure failure.

A third aspect of the invention provides a device fabricating method that comprises: exposing a substrate using an immersion exposure apparatus according to the abovementioned aspects; and developing the exposed substrate.

According to the third aspect of the invention, it is possible to prevent the fabrication of defective devices.

A fourth aspect of the invention, provides an immersion exposing method that exposes a substrate and comprises: exposing the substrate with exposure light through a liquid on the substrate; and recovering the liquid on the substrate using a liquid recovery system according to the abovementioned aspect during the exposure of the substrate.

According to the fourth aspect of the invention, it is possible to recover the liquid satisfactorily, and thereby to prevent exposure failure.

A fifth aspect of the invention provides a device fabricating method that comprises: exposing a substrate using an exposing method according to the abovementioned aspect; and developing the exposed substrate.

According to the fifth aspect of the invention, it is possible to prevent the fabrication of defective devices.

According to the some aspects of the present invention, it is possible to recover the liquid satisfactorily and thereby to prevent exposure failure. Accordingly, it is possible to prevent the fabrication of defective devices.

DESCRIPTION OF EMBODIMENTS

The following explains the embodiments of the present invention referencing the drawings, but the present invention is not limited thereto. Furthermore, the following explanation defines an XYZ orthogonal coordinate system and the positional relationships among members are explained referencing this system. Furthermore, prescribed directions within the horizontal plane are the X axial directions, the directions that are orthogonal to the X axial directions in the horizontal plane are the Y axial directions, and the directions that are orthogonal to the X axial directions and the Y axial directions (i.e., the vertical directions) are the Z axial directions. In addition, the rotational (the inclined) directions around the X, Y, and Z axes are the θX, θY, and θZ directions, respectively.

First Embodiment

Figure 1:
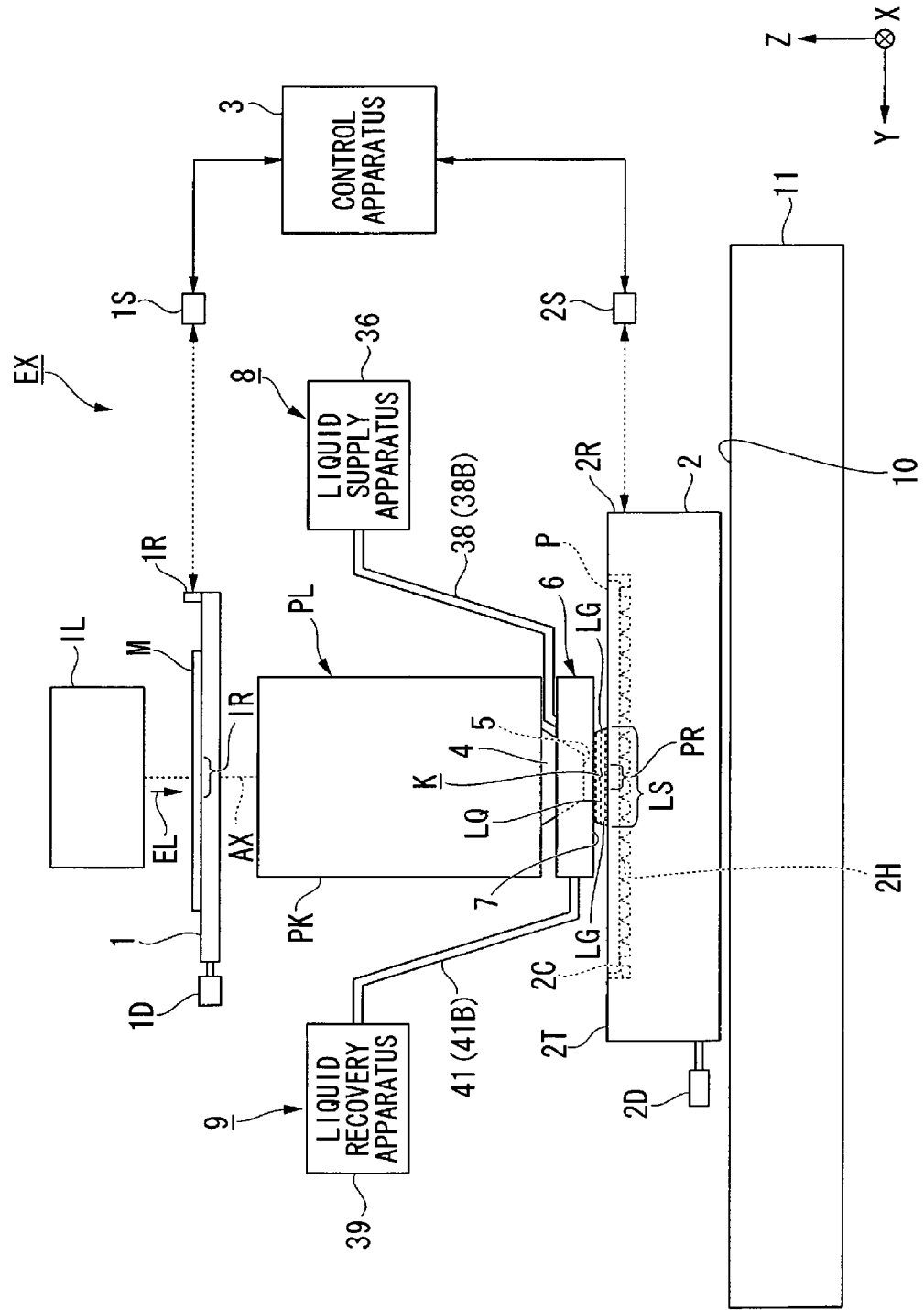
FIG. 1 is a schematic block diagram that shows an exposure apparatus according to a first embodiment.

A first embodiment will now be explained. FIG. 1 is a schematic block diagram that shows an exposure apparatus EX according to the first embodiment. In FIG. 1, the exposure apparatus EX comprises a mask stage 1, which is capable of moving while holding a mask M, a substrate stage 2, which is capable of moving while holding a substrate P, an illumination system IL, which illuminates the mask M with exposure light EL, a projection optical system PL, which projects an image of a pattern of the mask M that is illuminated by the exposure light EL onto the substrate P, and a control apparatus 3 that controls the operation of the entire exposure apparatus EX.

Furthermore, the substrate P referenced herein is a substrate for fabricating a device and can include one that has a base material, such as a semiconductor wafer such as a silicon wafer, whereon a film, such as a photosensitive material (photoresist), is formed, or include one on which various types of membrane such as a protective membrane (top coat membrane) in addition to a photosensitive membrane is coated. The mask M includes a reticle wherein a device pattern is formed mat is projected onto the substrate P. In addition, a transmitting type mask is used as the mask M in the present embodiment, but a reflection type mask can also be used. The transmission-type mask is not limited to a binary mask on which a pattern is formed with a shading film, and also includes, for example, a phase-shift mask such as a half-tone type or a spatial frequency modulation type.

The exposure apparatus EX of the present embodiment is an immersion exposure apparatus that exposes the substrate P with the exposure light EL through a liquid LQ and forms an immersion space LS so that at least part of an optical path space K of the exposure light EL is filled with the liquid LQ. Furthermore, the optical path space K of the exposure light EL is a space that includes the optical path through which the exposure light EL passes. The immersion space LS is a space that is filled with the liquid LQ. In the present embodiment, water (pure water) is used as the liquid LQ.

In the present embodiment, the immersion space LS is formed so mat the optical path space K on the image plane side of a last optical element 4, which is the optical element of a plurality of optical elements of the projection optical system PL closest to the image plane of the projection optical system PL, is filled with the liquid LQ. The last optical element 4 comprises an emergent surface 5 that emits the exposure light EL toward the image plane of the projection optical system PL. The immersion space LS is formed so that the optical path space K on the emergent side (the image plane side) of the last optical element 4 is filled with the liquid LQ.

The exposure apparatus EX comprises a liquid immersion member 6 that is capable of forming the immersion space LS. The liquid immersion member 6 is disposed in the vicinity of the last optical element 4.

The liquid immersion member 6 comprises a lower surface 7. An object that is movable at the emergent side (the image plane side) of the last optical element 4 is capable of moving to a position that opposes the emergent surface 5 of the last optical element 4, and is also capable of moving to a position that opposes the lower surface 7 of the liquid immersion member 6. When the object is disposed at a position that opposes the emergent surface 5 of the last optical element 4, at least part of the lower surface 7 of the liquid immersion member 6 and the front surface of the object are opposed. When the lower surface 7 of the liquid immersion member 6 and the front surface of the object are opposed, the liquid LQ can be held therebetween. In addition, when the emergent surface 5 of the last optical element 4 and the front surface of the object are opposed, the liquid LQ can be held therebetween. Holding the liquid LQ between the lower surface 7 of the liquid immersion member 6 and the emergent surface 5 of the last optical element 4 on one side and the front surface of the object on the other side makes it possible to form the immersion space LS so that the optical path space K between the emergent surface 5 of the last optical element 4 and the front surface of the object is filled with the liquid LQ.

In addition, the exposure apparatus EX comprises a supply mechanism 8 that supplies the liquid LQ and a recovery mechanism 9 that recovers the liquid LQ. The supply mechanism 8 is capable of supplying the liquid LQ between the front surface of the object and the lower surface 7 of the liquid immersion member 6 as well as between the front surface of the object and the emergent surface 5 of the last optical element 4. The recovery mechanism 9 is capable of recovering the liquid LQ between the front surface of the object and the lower surface 7 of the liquid immersion member 6 as well as between the front surface of the object and the emergent surface 5 of the last optical element 4.

In the present embodiment, the object that is capable of opposing the lower surface 7 of the liquid immersion member 6 and the emergent surface 5 of the last optical element 4 includes at least one of the substrate stage 2 and the substrate P that is held thereby. Furthermore, to simplify the explanation, the following principally explains the state wherein the substrate P opposes the lower surface 7 of the liquid immersion member 6 as well as the emergent surface 5 of the last optical element 4.

In the present embodiment, the immersion space LS is formed so that part of the area (a local area) of the front surface of the object, which is disposed at a position that opposes the lower surface 7 of the liquid immersion member 6 as well as the emergent surface 5 of the last optical element 4, is covered by the liquid LQ, and an interface (meniscus, edge) LG of the liquid LQ is formed between the front surface of the object and the lower surface 7 of the liquid immersion member 6. Namely, the exposure apparatus EX of the present embodiment adopts a local liquid immersion system wherein the immersion space LS is formed so that part of the area on the substrate P that includes a projection area PR of the projection optical system PL is covered with the liquid LQ during the exposure of the substrate P.

The illumination system IL illuminates a prescribed illumination region IR on the mask M with the exposure light EL, which has a uniform luminous flux intensity distribution. Examples of light that can be used as the exposure light EL emitted from the illumination system IL include: deep ultraviolet light (DUV light) such as bright line (g-line, h-line, or i-line) light emitted from, for example, a mercury lamp, and KrF excimer laser light (248 nm wavelength); and vacuum ultraviolet light (VUV light) such as ArF excimer laser light (193 nm wavelength) and $F_2$ laser light (157 nm wavelength). In the present embodiment, ArF excimer laser light, which is ultraviolet light (vacuum ultraviolet light), is used as the exposure light EL.

The mask stage 1, in the state wherein it holds the mask M, is movable in the X axial, Y axial, and θZ directions by a drive system 1D that comprises an actuator, e.g., a linear motor. A laser interferometer 1S measures positional information of the mask stage 1 (the mask M) in the X axis, Y axis, and θZ directions. The laser interferometer 1S measures the positional information using a reflecting mirror 1R, which is provided to the mask stage 1. Based on the measurement result of the laser interferometer 1S, the control apparatus 3 controls the position of the mask M, which is held by the mask stage 1, by driving the drive system 1D.

The projection optical system PL projects an image of the pattern of the mask M to the substrate P at a prescribed projection magnification. A lens barrel PK holds the plurality of optical elements of the projection optical system PL. The projection optical system PL of the present embodiment is a reduction system that has a projection magnification of, for example, ¼, ⅕, or ⅛. Furthermore, the projection optical system PL may be a reduction system, a unity magnification system or an enlargement system. In the present embodiment, an optical axis AX of the projection optical system PL is parallel to the Z axial directions. In addition, the projection optical system PL may be: a dioptric system that does not include catoptric elements; a catoptric system that does not include dioptric elements; or a catadioptric system that includes both catoptric elements and dioptric elements. In addition, the projection optical system PL may form either an inverted image or an erect image.

The substrate stage 2, in the state wherein it holds the substrate P, can be moved with six degrees of freedom, i.e., in the X axial, Y axial, Z axial, θX, θY, and θZ directions, by a drive system 2D that comprises an actuator, e.g., a linear motor. A laser interferometer 2S measures positional information of the substrate stage 2 (the substrate P) in the X axial, the Y axial, and the θZ directions. The laser interferometer 2S measures the positional information using a reflecting mirror 2R, which is provided to the substrate stage 2. In addition, a focus and level detection system (not shown) detects the surface position information (positional information in the Z axial, θX, and θY directions) of the front surface of the substrate P, which is held by the substrate stage 2. Based on the measurement results of the laser interferometer 2S and the detection results of the focus and level detection system, the control apparatus 3 controls the position of the substrate P, which is held by the substrate stage 2, by driving the drive system 2D.

The substrate stage 2 comprises a substrate holder 2H, which holds the substrate P, and an upper surface 2T, which is disposed around the substrate holder 2H and is capable of opposing the emergent surface 5 of the last optical element 4. The substrate holder 2H is disposed in a recessed part 2C, which is provided in the substrate stage 2. The substrate holder 2H holds the substrate P so that the front surface thereof and the XY plane are substantially parallel. The front surface of the substrate P held by the substrate holder 2H is capable of opposing the emergent surface 5 of the last optical element 4. In addition, the upper surface 2T of the substrate stage 2 is a flat surface that is substantially parallel to the XY plane. The front surface of the substrate P held by the substrate holder 2H and the upper surface 2T of the substrate stage 2 are disposed in substantially the same plane and are substantially flush with one another. The upper surface 2T is formed from a material that includes, for example, fluorine, and is therefore liquid repellent with respect to the liquid LQ.

The exposure apparatus EX comprises a base plate 11, which comprises a guide surface 10 that movably supports the substrate stage 2. In the present embodiment, the guide surface 10 is substantially parallel to the XY plane. The substrate stage 2 is capable of moving along the guide surface 10 in the X and Y directions (the two dimensional directions).

The exposure apparatus EX of the present embodiment is a scanning type exposure apparatus (a so-called scanning stepper) that projects the image of the pattern formed on the mask M onto the substrate P while synchronously moving the mask M and the substrate P in prescribed scanning directions. In the present embodiment, the scanning directions (the synchronous movement directions) of the substrate P and of the mask M are the Y axial directions. The exposure apparatus EX moves the substrate P in the Y axial directions with respect to the projection area PR of the projection optical system PL, and radiates the exposure light EL onto the substrate P through the projection optical system PL and the liquid LQ while moving the mask M in the Y axial directions with respect to the illumination area IR of the illumination system IL synchronized to the movement of the substrate P in the Y axial directions. Thereby, the image of the pattern of the mask M is projected onto the substrate P, which is thereby exposed with the exposure light EL.

Figure 2:
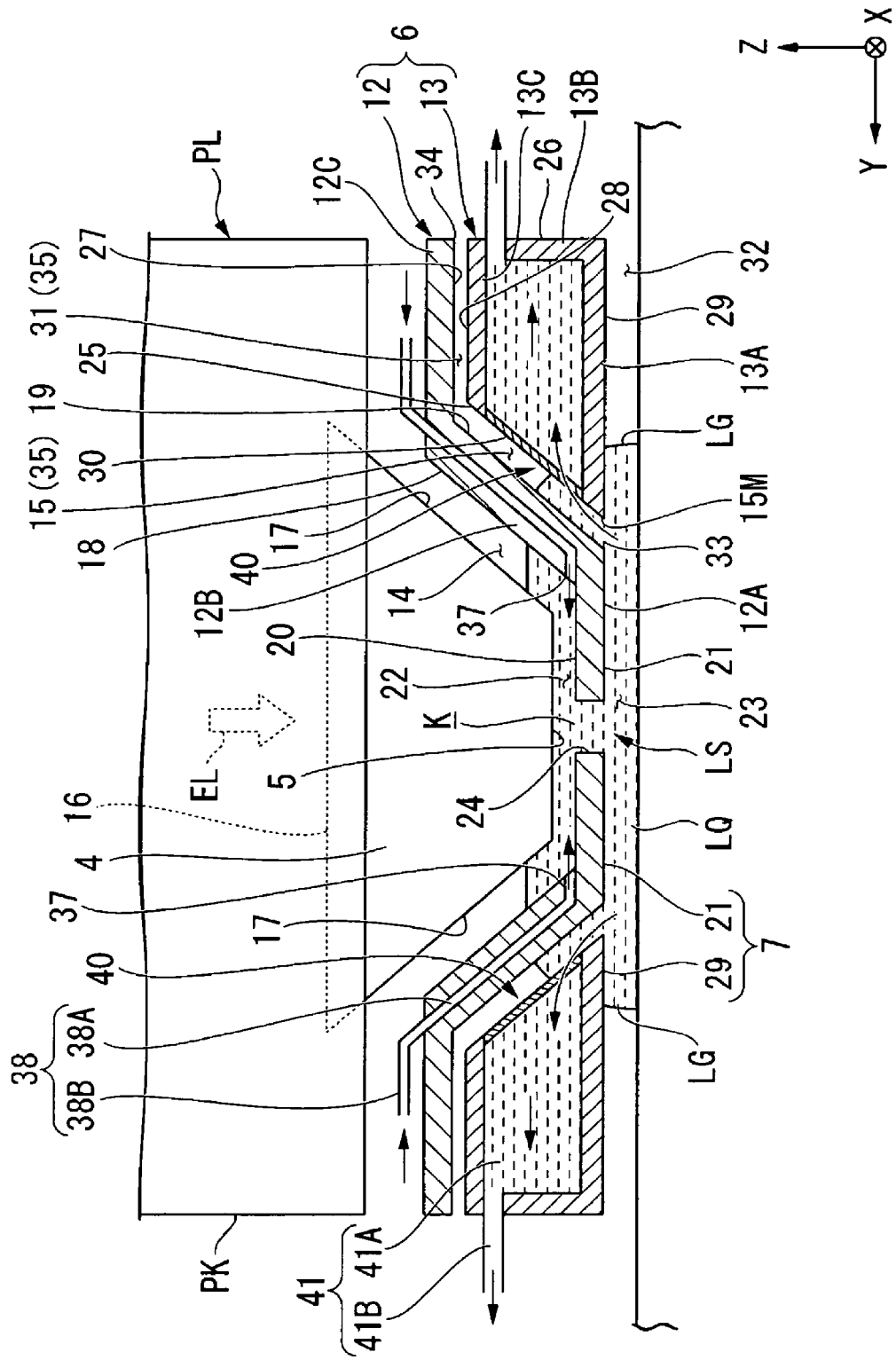
FIG. 2 is a cross sectional view that shows the vicinity of an immersion member according to the first embodiment.
Figure 3:
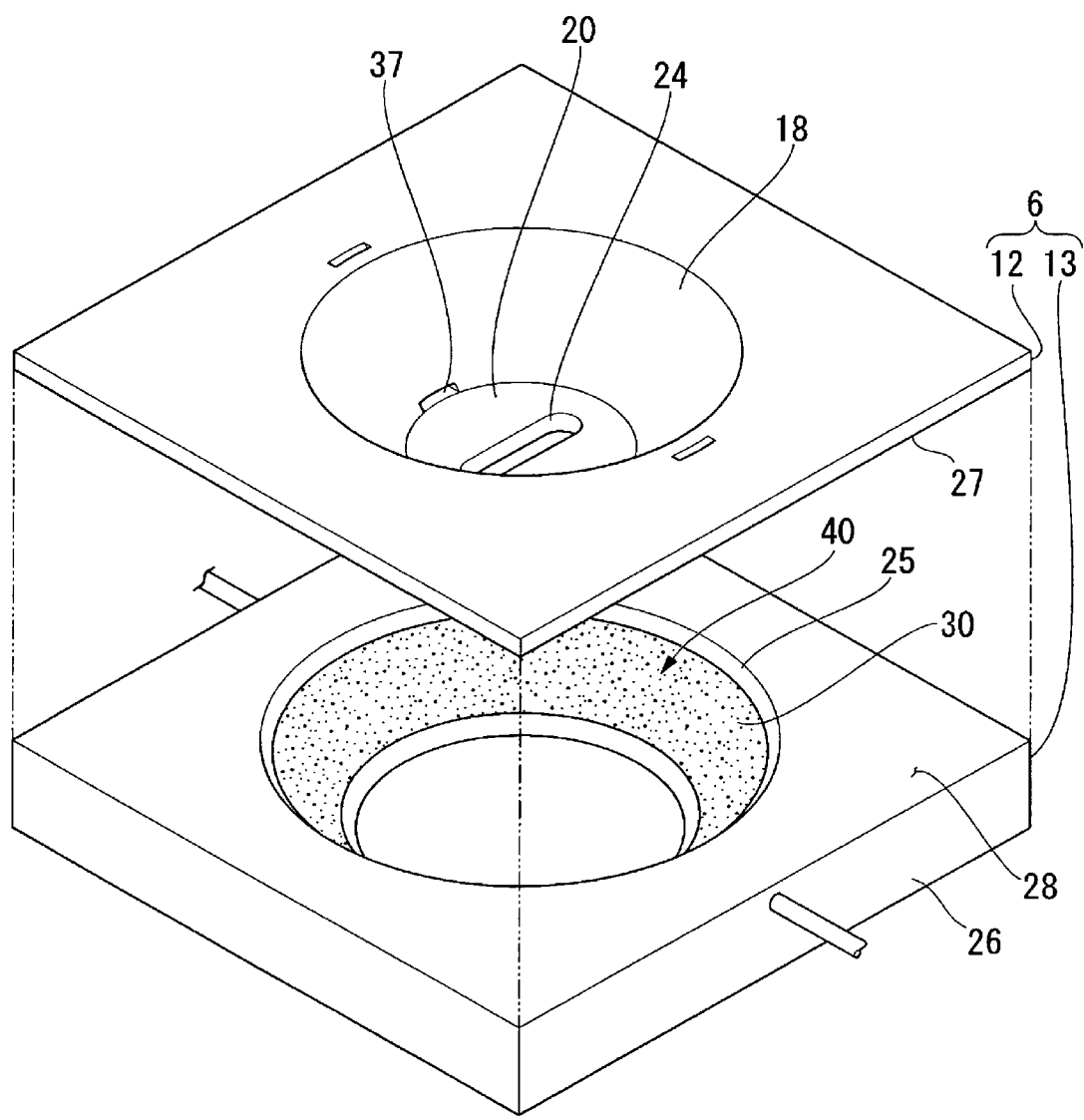
FIG. 3 is a perspective view for explaining the immersion member according to the first embodiment.
Figure 4:
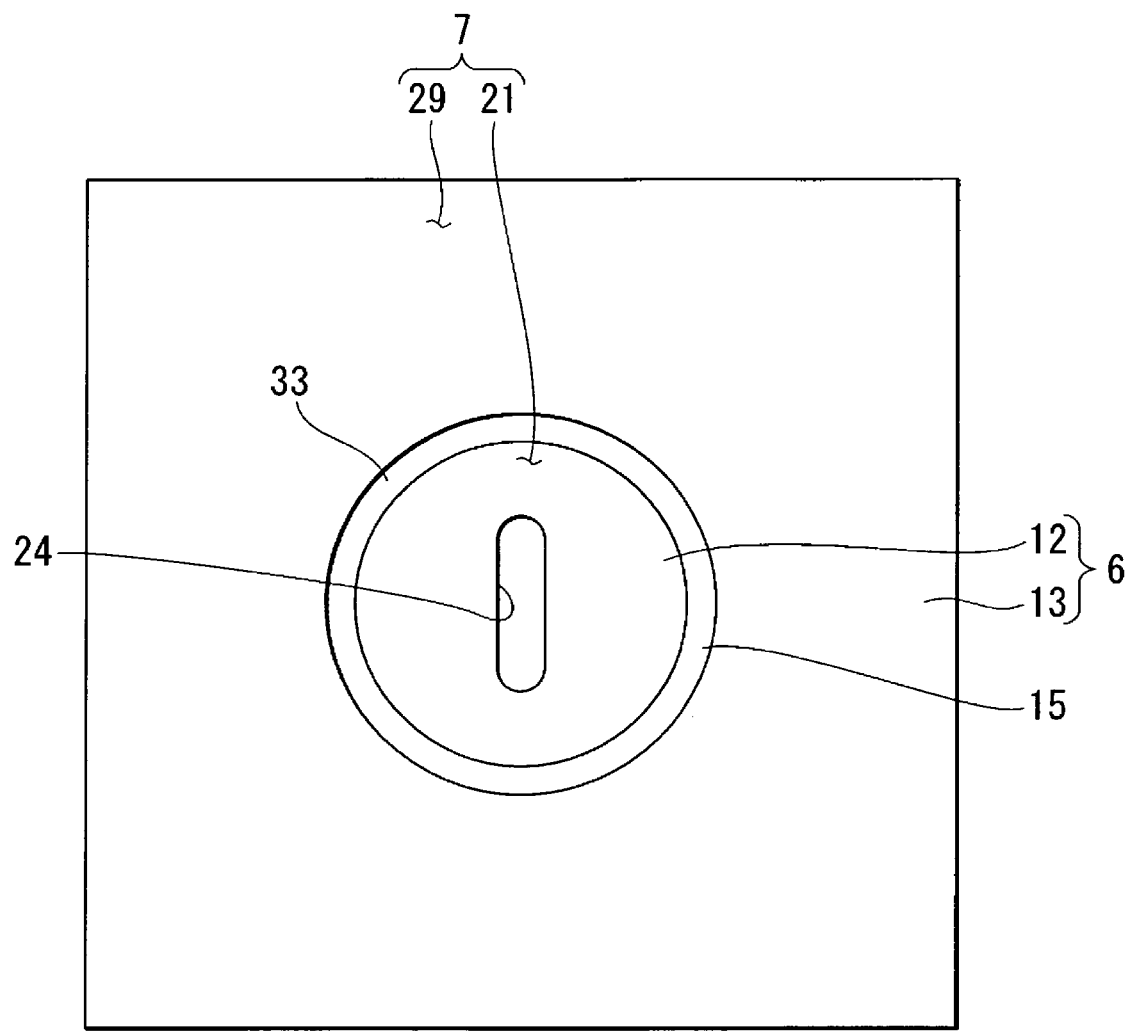
FIG. 4 shows the immersion member according to the first embodiment, viewed from below.

The following explains the liquid immersion member 6, the supply mechanism 8, and the recovery mechanism 9, referencing FIG. 1 through FIG. 4. FIG. 2 is a side cross sectional view that shows the vicinity of the liquid immersion member 6, FIG. 3 is a perspective view that shows the liquid immersion member 6, and FIG. 4 shows the liquid immersion member 6 viewed from the lower surface 7 side. Furthermore, FIG. 3 shows the liquid immersion member 6 in an exploded state.

Furthermore, the following explains an exemplary case wherein the substrate P is disposed at a position that opposes the lower surface 7 of the liquid immersion member 6 as well as the emergent surface 5 of the last optical element 4; however, as discussed above, an object other than the substrate P, such as the substrate stage 2, can also be disposed at a position that opposes the lower surface 7 of the liquid immersion member 6 as well as the emergent surface 5 of the last optical element 4. In addition, in the explanation below, the emergent surface 5 of the last optical element 4 is properly called the lower surface 5 of the last optical element 4.

In FIG. 1 through FIG. 4, the liquid immersion member 6 comprises a first member 12 and a second member 13 that is different from the first member 12. The first member 12 and the second member 13 are annular members. The first member 12 is provided in the vicinity of the last optical element 4 so that it surrounds the optical path of the exposure light EL. In the present embodiment, the first member 12 is disposed on the outer side of the last optical element 4 with respect to the optical path of the exposure light EL so that it surrounds the last optical element 4 with a gap 14 interposed therebetween. The second member 13 is provided on the outer side of the first member 12 with respect to the optical path of the exposure light EL so that it surrounds the first member 12 with a gap 15 interposed therebetween.

In the present embodiment, the last optical element 4 comprises an incident surface 16 that the exposure light EL from an object plane of the projection optical system PL impinges, the emergent surface (lower surface) 5, which emits the exposure light EL toward the image plane of the projection optical system PL, and an outer circumferential surface (side surface) 17, which connects the outer circumference of the incident surface 16 to the outer circumference of the emergent surface 5. In the present embodiment, the emergent surface (lower surface) 5 is substantially parallel to the XY plane. The outer circumferential surface 17 is inclined so that its distance to the front surface of the substrate P increases as it becomes increasingly spaced apart from the optical path of the exposure light EL.

The first member 12 comprises an inner circumferential surface 18, which is formed along the outer circumferential surface 17 of the last optical element 4 and opposes such, an outer circumferential surface 19, which is disposed on the outer side of the inner circumferential surface 18 with respect to the last optical element 4, an upper surface 20, which opposes part of the lower surface 5 of the last optical element 4, and a lower surface 21, which opposes the front surface of the substrate P.

The first member 12 comprises a lower plate part 12A, at least part of which is disposed in the Z axial directions between the lower surface 5 of the last optical element 4 and the front surface of the substrate P, a side plate part 12B, which is connected to the outer circumference of the lower plate part 12A and is disposed so that it surrounds the outer circumferential surface 17 of the last optical element 4, and an upper plate part 12C, which is connected to the outer circumference of the side plate part 12B at its upper end and is disposed so that it surrounds the outer circumferential surface 17 of the last optical element 4. The outer circumference of the lower plate part 12A is connected to the inner circumference of the side plate part 12B at its lower end.

Furthermore, in the present embodiment, the first member 12 is formed from a single member that comprises the lower plate part 12A, the side plate part 12B, and the upper plate part 12C; however, the lower plate part 12A, the side plate part 12B, and the upper plate part 12C may be formed from a plurality of members that are then connected to form the first member 12.

The inner circumferential surface 18 of the first member 12 includes one surface of the side plate part 12B and is disposed so that it opposes the outer circumferential surface 17 of the last optical element 4 with the gap 14 interposed therebetween. The outer circumferential surface 19 of the first member 12 includes another surface of the side plate part 12B and is substantially parallel to the inner circumferential surface 18. Furthermore, the outer circumferential surface 19 can be non-parallel to the inner circumferential surface 18.

The upper surface 20 of the first member 12 includes an upper surface of the lower plate part 12A and is disposed so that it opposes the lower surface 5 of the last optical element 4 with a gap 22 interposed therebetween. The upper surface 20 of the first member 12 is a flat surface that is substantially parallel to the XY plane.

The lower surface 21 of the first member 12 includes the lower surface of the lower plate part 12A. For example, during the exposure of the substrate P, the front surface of the substrate P is disposed so that it opposes the lower surface 21 of the first member 12 with a gap 23 interposed therebetween. The lower surface 21 of the first member 12 is a flat surface that is substantially parallel to the XY plane.

In addition, the lower plate part 12A comprises an opening 24 at its center. The opening 24 is capable of transmitting the exposure light EL that emerges from the lower surface 5 of the last optical element 4. For example, during an exposure of the substrate P, the exposure light EL that emerges from the lower surface 5 of the last optical element 4 passes through the opening 24 and is radiated to the front surface of the substrate P. In the present embodiment, the cross sectional shape of the exposure light EL in the opening 24 is substantially rectangular (slit shaped) with the longitudinal directions in the X axial directions. The opening 24 is formed in a substantially rectangular shape (a slit shape) in the X and Y directions in accordance with the cross sectional shape within the XY plane of the exposure light EL. In addition, the cross sectional shape of the exposure light EL in the opening 24 and the shape of the projection area PR of the projection optical system PL on the substrate P are substantially the same. The upper surface 20 and the lower surface 21 of the first member 12 are formed around the evening 24.

In the explanation below, the lower surface 21 of the first member 12 is properly called the first land surface 21.

The second member 13 comprises an inner circumferential surface 25, which is formed along the outer circumferential surface 19 of the first member 12 and opposes such, an outer circumferential surface 26, which is disposed on the outer side of the inner circumferential surface 25 with respect to the first member 12, an upper surface 28, which opposes a lower surface 27 of the upper plate part 12C of the first member 12, and a lower surface 29, which opposes the front surface of the substrate P.

The second member 13 comprises a lower plate part 13A, which opposes the front surface of the substrate P, an upper plate part 13C, which opposes the upper plate part 12C of the first member 12, a side plate part 13B, which is disposed so that it connects the outer circumference of the lower plate part 13A to the outer circumference of the upper plate part 13C, and a porous member 30, which is disposed so that it connects the vicinity of the inner circumference of the lower plate part 13A to the vicinity of the inner circumference of the upper plate part 13C. Furthermore, in the present embodiment, the second member 13 may be formed from a single member that comprises the lower plate part 13A, the side plate part 13B, and the upper plate part 13C; however, the lower plate part 13A, the side plate part 13B, and the upper plate part 13C may be formed from a plurality of members that are joined together to form the second member 13.

The inner circumferential surface 25 of the second member 13 comprises the front surface of the porous member 30, the inner side surface of the lower plate part 13A, and the inner side surface of the upper plate part 13C, and is disposed so mat it opposes the outer circumferential surface 19 of the first member 12 with the gap 15 interposed therebetween. In the present embodiment, the outer circumferential surface 19 of the first member 12 and the inner circumferential surface 25 of the second member 13 are substantially parallel. Furthermore, the outer circumferential surface 19 of the first member 12 and the inner circumferential surface 25 of the second member 13 can be non-parallel.

The upper surface 28 of the second member 13 comprises the upper surface of the upper plate part 13C and is disposed so that it opposes the lower surface 27 of the upper plate part 12C of the first member 12 with a gap 31 interposed therebetween. The upper surface 28 of the second member 13 and the lower surface 27 of the upper plate part 12C of the first member 12 are flat surfaces that are substantially parallel to the XY plane.

The lower surface 29 of the second member 13 comprises the lower surface of the lower plate part 13A. For example, during the exposure of the substrate P, the front surface of the substrate P is disposed so that it opposes the lower surface 29 of the second member 13 with a gap 32 interposed therebetween. The lower surface 29 of the second member 13 is a flat surface that is substantially parallel to the XY plane.

In the explanation below, the lower surface 29 of the second member 13, which is disposed around the first land surface 21, is properly called the second land surface 29.

In the present embodiment, the first member 12 and the second member 13 are supported by a support mechanism (not shown) with a prescribed positional relationship. In the present embodiment, the first member 12 and the second member 13 are disposed with a prescribed positional relationship so that the outer circumferential surface 19 of the first member 12 and the inner circumferential surface 25 of the second member 13 are opposed. In addition, in the present embodiment, the first member 12 and the second member 13 are disposed with a prescribed positional relationship so that the first land surface 21 and the second land surface 29 are disposed within the same plane (within the XY plane), i.e., so that they are substantially flush.

A first opening 33 is formed between the first land surface 21 and the second land surface 29. The first opening 33 is disposed at a lower end of the gap 15, and the front surface of the substrate P is capable of moving to a position that opposes the first opening 33. The first opening 33 is provided as an annular slit that surrounds the first land surface 21. In the present embodiment, the first opening 33 is provided in the shape of a circular ring. The width of the first opening 33 (the slit width) varies with the size of the gap 15. In the present embodiment, the spacing between the outer circumferential surface 19 of the first member 12 and the inner circumferential surface 25 of the second member 13 is substantially equal to the width of the first opening 33 (the spacing between the first land surface 21 and the second land surface 29). In addition, the gap 15 is also provided annularly along the first opening 33 so that it surrounds the first member 12.

A second opening 34 is formed between the outer circumference of the lower surface 27 of the upper plate part 12C of the first member 12 and the outer circumference of the upper surface 28 of the second member 13. The second opening 34 is disposed on the outer side end of the gap 31 with respect to the optical path of the exposure light EL at a position that does not oppose the front surface of the substrate P. The second opening 34 is disposed on the +Z side of the first opening 33. In addition, in the present embodiment, the second opening 34 is disposed on the outer side of the first opening 33 with respect to the optical path of the exposure light EL.

In the present embodiment, the first opening 33, the second opening 34, and the gap 15 are provided between the first member 12 and the second member 13.

In the present embodiment, the lower surface 7 of the liquid immersion member 6 comprises the first land surface 21, which is disposed on the inner side of the first opening 33 with respect to the optical path of the exposure Light EL, and the second land surface 29, which is disposed on the outer side of the first opening 33 with respect to the optical path of the exposure light EL. When the liquid immersion member 6 and the substrate P are opposed, the liquid LQ can be held between the first land surface 21 and the front surface of the substrate P and between the second land surface 29 and the front surface of the substrate P. For example, in FIG. 2, part of the liquid LQ on the substrate P is held between the front surface of the substrate P and the first land surface 21 and between the front surface of the substrate P and the second land surface 29. For example, during the exposure of the substrate P, the immersion space LS is formed by holding the liquid LQ between the front surface of the substrate P and the lower surface 7 of the liquid immersion member 6, which comprises the first land surface 21 and the second land surface 29.

In the present embodiment, the first land surface 21 and the second land surface 29 of the first member 12 and the second member 13 are formed from, for example, titanium and are lyophilic (liquid-attractive) with respect to the liquid LQ. For example, a contact angle CA1 between the first land surface 21 and the liquid LQ and a contact angle CA2 between the second land surface 29 and the liquid LQ are both preferably less than 40°, and are more preferably less than 20°. Furthermore, the contact angle CA1 and the contact angle CA2 may be different.

As shown in FIG. 2, the first opening 33 is capable of contacting the liquid LQ (the liquid LQ of the immersion space LS) on the substrate F. Namely, the first opening 33 is provided at a position at which the liquid LQ on the substrate P can flow therethrough.

Moreover, in the present embodiment, the second opening 34 is disposed at a position that does not oppose the front surface of the substrate P. The second opening 34 is located above me first opening 33. The second opening 34 is farmer away from the front surface of the substrate P than the first opening 33 is. The second opening 34 is not capable of contacting the liquid LQ (the liquid LQ of the immersion space LS) on the substrate P. Namely, the second opening 34 is disposed at a position at which the liquid LQ on the substrate P, which opposes the first opening 33, does not flow therethrough.

The second opening 34 is disposed at a position at which it can contact a gas in an external space (the ambient environment) that surrounds the liquid immersion member 6 (the immersion space LS). Namely, the second opening 34 is provided at a position at which the gas in the external space can flow therethrough.

The gas in the external space is capable of flowing into the gaps 15, 31 through the second opening 34, and the gas in the gaps 15, 31 is capable of flowing out to the external space through the second opening 34. Furthermore, the gap 15 and the gap 31 are connected (they are integral). In the explanation below, the combination of the gap 15 and the gap 31 is properly called a gap 35.

In the present embodiment, the gas is capable of continuously flowing back and forth between the gap 35 and the external space (the atmospheric space) on the outer side of the gap 35 through the second opening 34. Namely, the gap 35 is open to the atmosphere through the second opening 34.

The state wherein the gap 35 is open to the atmosphere includes the state wherein the gap 35 is continuously in communication with the gas space that surrounds the liquid immersion member 6 (that surrounds the immersion space LS). For example, even if the entire area of the first opening 33 is covered with the liquid LQ of the immersion space LS in the state wherein the gap 35 is open to the atmosphere, the gas can still flow back and forth between the gap 35 and the external space (the ambient environment) through the second opening 34. Furthermore, in general, the exposure apparatus EX is disposed in an environmentally controlled chamber, and "open to the atmosphere" discussed above includes the state wherein the gap 35 is in communication with the gas space inside the chamber. In addition, the gas in the external space is not necessarily air and may be, for example, nitrogen.

The supply mechanism 8 comprises a liquid supply apparatus 36, which is capable of feeding the clean, temperature adjusted liquid LQ, supply ports 37, which are disposed in the vicinity of the optical path space K, and passageways 38, which connect the liquid supply apparatus 36 and the supply ports 37.

In the present embodiment, the supply ports 37 are formed in the first member 12. Each passageway 38 comprises a supply passageway 38A, which is formed inside the first member 12, and a passageway 38B, which is formed from a supply pipe that connects the supply passageway 38A and the liquid supply apparatus 36. The liquid LQ that is fed from the liquid supply apparatus 36 is supplied to each supply port 37 through the corresponding passageway 38. The supply ports 37 supply the liquid LQ from the liquid supply apparatus 36 to the optical path space K.

In the present embodiment, the supply ports 37 are connected to the gap 22 between the lower surface 5 of the last optical element 4 and the upper surface 20 of the first member 12, and are capable of supplying the liquid LQ to the gap 22. In addition, in the present embodiment, two supply ports 37 are provided on opposite sides of the optical path space K in the Y axial directions, one on each side. Furthermore, two supply ports 37 may be provided on opposite sides of the optical path space K in the X axial directions, one on each side. The number of the supply ports is not limited two but can be varied as required.

In the present embodiment, the supply ports 37 are disposed on the inner side of the first opening 33 with respect to the optical path of the exposure light EL.

The recovery mechanism 9 comprises a liquid recovery apparatus 39, which includes a vacuum system and is capable of recovering the liquid LQ by suction, a recovery part 40, which is capable of recovering the liquid LQ, and a passageway 41, which connects the liquid recovery apparatus 39 and the recovery part 40. The vacuum system of the recovery mechanism 9 does not have to include a vacuum pump. A vacuum pump included in the factory, which is provided with the exposure apparatus EX, and the like can be used.

In the present embodiment, the gap 15 is provided so that the liquid LQ on the substrate P, which opposes the first opening 33, can flow into the gap 15 through the first opening 33. Namely, at least part of the liquid LQ between the lower surface 7 (the first land surface 21 and the second land surface 29) of the liquid immersion member 6 and the front surface of the substrate P can flow into the gap 15 through the first opening 33. The recovery part 40 is disposed at a position at which it can suction the liquid LQ that flows into the gap 15 through the first opening 33. In other words, the recovery part 40 is disposed at a position at which it contacts the liquid LQ that flows into the gap 15 through the first opening 33. The recovery part 40 is disposed above the first opening 33 on the inner side of the gap 15.

The recovery part 40 is disposed in a plane that faces a direction that is different from the direction that the lower surface 7 (the first land surface 21 and the second land surface 29) of the liquid immersion member 6 faces, and includes a suction port that is capable of recovering the liquid LQ. In the present embodiment, the recovery part 40 is disposed in one portion of the second member 13, which opposes the outer circumferential surface 19 of the first member 12.

In the present embodiment, a suction passageway (space) 41A, which comprises an opening that opposes the outer circumferential surface 19 of the first member 12, is formed in the second member 13 by the lower plate part 13A, the upper plate part 13C, and the side plate part 13B, and the recovery part 40 is disposed in the opening of the space 41A. In the present embodiment, the recovery part 40 is provided annularly along the gap 15.

The recovery part 40 comprises a porous member (mesh member) 30, which is disposed so that it covers the suction port. In the present embodiment, the porous member 30 has a plate in which pores (through-holes) are formed. Alternatively, as the porous member, a sintered member in which a plurality of pores are formed (for example, a sintered metal), foam member (for example, a foam metal), or the like may be used. The front surface of the porous member 30 forms at least part of the inner circumferential surface 25 of the second member 13, which opposes the outer circumferential surface 19 of the first member 12.

In the present embodiment, the recovery part 40 suctions, through the porous member 30, at least part of the liquid LQ that flows into the gap 15 through the first opening 33.

In the present embodiment, the passageway 41 comprises the suction passageway 41A, which is formed in the second member 13, and a passageway 41B, which is formed from a recovery pipe that connects the suction passageway 41A and the liquid recovery apparatus 39. By means of the liquid recovery apparatus 39 the negative pressure in the suction passageway 41A is adjusted, and at least a part of the liquid LQ in the gap 15 is suctioned via the recovery part 40. The liquid LQ suctioned via the recovery part 40 is recovered in the liquid recovery apparatus 39 through the passageway 41. In other words, the porous member 30 has a first face which faces the first member 12, a second face which faces the suction passageway 41A, and a plurality of pores which are in communication with the first and the second faces (i.e., the pores fluidically connect the first face to the second face). The liquid recovery apparatus 39 creates a pressure difference between the sides of the first and the second faces of the porous member 30. As a result, at least a part of the liquid LQ in the gap 15 is suctioned into the suction passageway 41A via the porous member 30, and is recovered to the liquid recovery apparatus 39.

The gap 15 is formed between the front surface (the first face) of the porous member 30 and the outer circumferential surface 19 of the first member 12. The front surface of the porous member 30 is disposed above the first opening 33 at a position at which it can contact the liquid LQ that flows into the gap 15 through the first opening 33.

In the present embodiment, the gap 15 is inclined so that the distance to the front surface of a substrate P increases as it becomes increasingly spaced apart from the optical path of the exposure light EL. The front surface of the porous member 30 opposes the outer circumferential surface 19 of the first member 12 and is oriented in a direction that is different than the direction that the lower surface 7 (the first land surface 21 and the second land surface 29) of the liquid immersion member 6 faces. Namely, the recovery part 40 (the front surface of the porous member 30) is disposed so that it does not oppose the front surface of the substrate P. Specifically, the front surface of the porous member 30 is upwardly inclined (in the +Z direction) so that the distance to the front surface of the substrate P increases as it becomes increasingly spaced apart from the optical path of the exposure light EL.

Thus, the gap 15 is inclined, and therefore the liquid LQ can flow smoothly into the gap 15 through the first opening 33.

In addition, the gap 15 is open to the atmosphere through the second opening 34, and therefore the liquid LQ can flow smoothly into the gap 15 through the first opening 33.

In addition, the gap 15 comprises a gap 15M in the vicinity of the first opening 33. The gap 15M is formed between the inner side surface of the lower plate part 13A of the second member 13 and the outer circumferential surface 19 of the first member 12. In the present embodiment, capillarity makes it possible for the gap 15M in the vicinity of the first opening 33 to hold the liquid LQ. Namely, the gap 15M has a size (a width) such that it is capable of holding the liquid LQ by capillary action. For example, the spacing between the inner side surface of the lower plate part 13A of the second member 13 and the outer circumferential surface 19 of the first member 12 is 0.5 to 2.0 mm. The gap 15M can draw the liquid LQ with the capillary force. Namely, the gap 15M forms the capillary tube 15M into which the liquid LQ can flow by capillary action.

In the present embodiment, the front surface of the porous member 30 is disposed at a position above the first opening 33 at which it is capable of contacting the liquid LQ that flows into the capillary tube 15M through the first opening 33 and rises (is transported) by the capillary action of the capillary tube 15M. In other words, the length of the capillary tube 15M (the distance between the lower end of the porous member 30 and the first opening 33) is set so that the liquid LQ that flows in from the first opening 33 reaches the front surface of the porous member 30 by capillary action. The liquid LQ that contacts the first opening 33 is drawn into the capillary tube 15M by capillary action and contacts the front surface of the porous member 30.

In addition, in the recovery mechanism 9 of the present embodiment, liquid recovery conditions, which include the size of the holes of the porous member 30, the surface tension of the liquid LQ with respect to the porous member 30, and the pressure of the suction passageway 41A with respect to the pressure of the gap 15 (35) (the pressure of the external space) (i.e., the pressure difference between the first and the second faces of the porous member 30), are set so as to prevent the gas inside the gap 15 from passing through the porous member 30, as disclosed in, for example, PCT International Publication No. WO2005/024517, and U.S. Patent Application, Publication No. 2007/0222959. Namely, in the present embodiment, the liquid recovery conditions are set so that only the liquid LQ inside the gap 35 passes through the porous member 30 and flows into the suction passageway 41A, and the gas inside the gap 35 substantially does not pass through the porous member 30. In other words, the recovery part 40 of the present embodiment only suctions (recovers) the liquid LQ and does not suction the gas.

If the recovery part 40 suctions the liquid LQ and the gas together, then there is a possibility that vibrations will occur. In the present embodiment, the recovery part 40 only suctions the liquid LQ through the porous member 30, and therefore can prevent such vibrations.

The following explains a method of using the exposure apparatus EX that has the abovementioned configuration to perform au immersion expose on the substrate P.

To form the immersion space LS, the control apparatus 3 supplies the liquid LQ to the optical path space K of the exposure light EL using the supply mechanism 8. When the liquid LQ is to be supplied, the control apparatus 3 disposes the object, such as the substrate P (the substrate stage 2), at a position that opposes the lower surface 7 of the liquid immersion member 6 and the lower surface 5 of the last optical element 4. The liquid LQ that is fed from the liquid supply apparatus 36 is supplied to the supply ports 37 through the passageway 38. The supply ports 37 supply the liquid LQ to the gap 22 between the lower surface 5 of the last optical element 4 and the upper surface 20 of the first member 12. The liquid LQ flows through the gap 22 between the lower surface 5 of the last optical element 4 and the upper surface 20 of the first member 12, flows through the opening 24 into the gap 23 between the first land surface 21 of the first member 12 and the front surface of the substrate P, and is then held between the first land surface 21 of the first member 12 and the front surface of the substrate P. In addition, at least part of the liquid LQ flows into the gap 32 between the second land surface 29 of the second member 13 and the front surface of the substrate P and is held therebetween. In so doing, the immersion space LS is formed so that the gap 22 and the gap 23 are filled with the liquid LQ and so that the optical path space K between the lower surface 5 of the last optical element 4 and the front surface of the substrate P is filled with the liquid LQ.

In addition, in the present embodiment, the control apparatus 3 performs the liquid recovery operation with the recovery mechanism 9 in parallel with the liquid supply operation with the supply mechanism 8. At least part of the liquid LQ on the substrate P flows through the first opening 33 into the gap 15. The liquid LQ on the substrate P rises inside the gap 15 (inside the capillary tube 15M) due to, for example, capillary action. Inside the gap 15, the liquid LQ that contacts the front surface of the porous member 30 is suctioned through the porous member 30 of the recovery part 40. The liquid LQ that is suctioned by the recovery part 40 is recovered through the passageway 41 by the liquid recovery apparatus 39.

The control apparatus 3 performs the liquid supply operation with the supply mechanism 8 and the liquid recovery operation with the recovery mechanism 9 in parallel, and therefore can continuously and locally form an immersion area on the substrate P with the liquid LQ that has desired conditions (for example, temperature and cleanliness level).

After the immersion space LS has been formed, the control apparatus 3 starts the exposure of the substrate P. As discussed above, the exposure apparatus EX of the present embodiment is a scanning type exposure apparatus. The control apparatus 3 radiates the exposure light EL to the substrate P through the projection optical system PL and the liquid LQ on the substrate P while the front surface of the substrate P moves in one of the Y axial directions with respect to the optical path of the exposure light EL and the immersion space LS in a state wherein the immersion space LS is formed by holding the liquid LQ between the lower surface 7 of the liquid immersion member 6 and the front surface of the substrate P. Thereby, the image of the pattern of the mask M is projected onto the substrate P, which is thereby exposed with the exposure light EL.

In addition, in order to start the exposure of a second shot region after the exposure of, for example, a first shot region on the substrate P is complete, the control apparatus 3 performs an operation that moves the front surface of the substrate P in one of the X axial directions (or a direction that is inclined with respect to the X axial directions within the XY plane) in a state wherein the immersion space LS is formed.

In the present embodiment, even if the front surface of the substrate P is moved in the X and Y directions, the liquid LQ between the lower surface 7 of the liquid immersion member 6 and the front surface of the substrate P does not leak to the outer side of the space (the gap 32) between the lower surface 7 of the liquid immersion member 6 and the front surface of the substrate P.

Figure 5A:
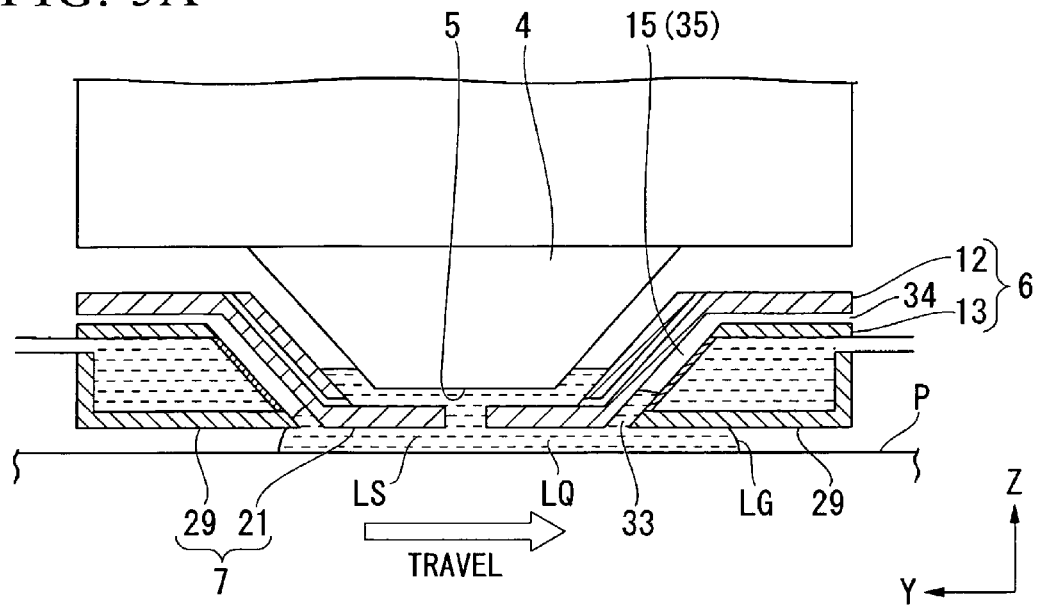
FIG. 5A shows one example of the operation of the exposure apparatus according to the first embodiment.
Figure 5B:
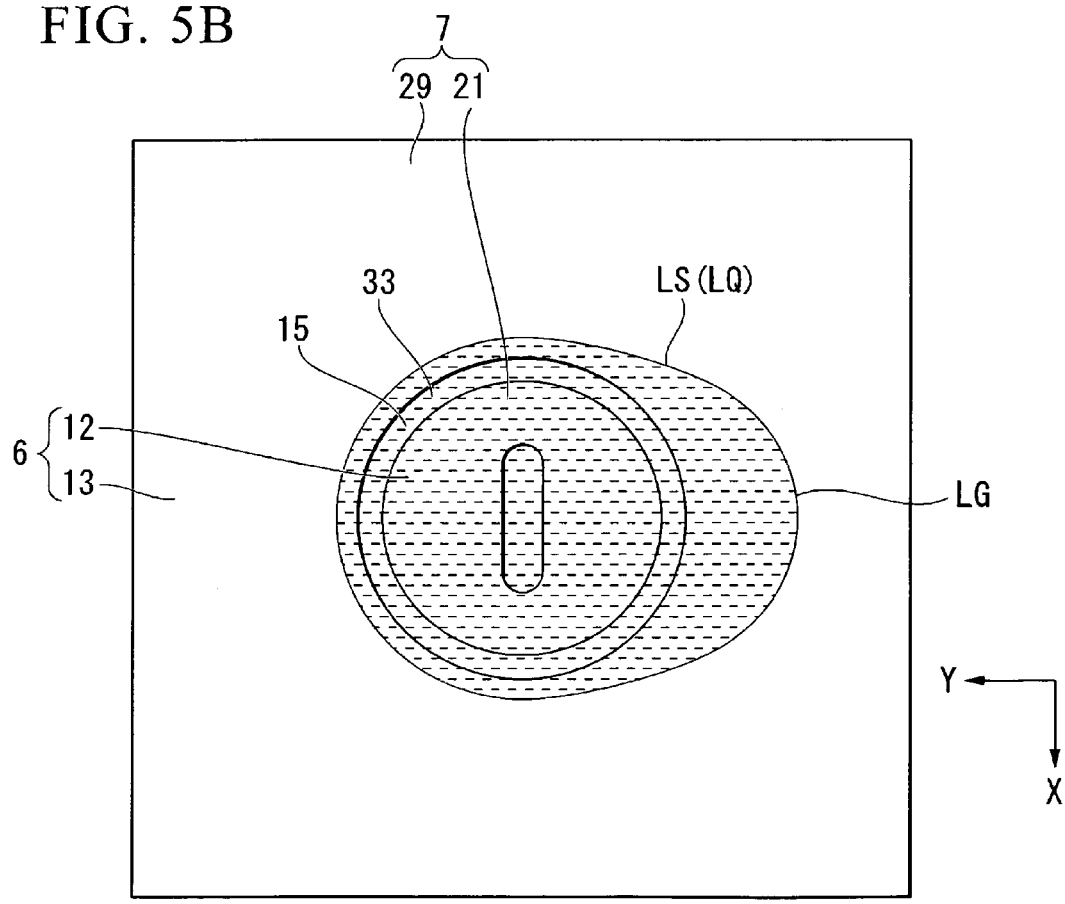
FIG. 5B shows one example of the operation of the exposure apparatus according to the first embodiment.

FIGS. 5A and 5B are schematic drawings that show the state wherein the front surface of the substrate P is moved in one of the Y axial directions with respect to the optical path of the exposure light EL and the immersion space LS; therein, FIG. 5A is a side cross sectional view and FIG. 5B shows the liquid immersion member 6 viewed from below. As shown in FIGS. 5A and 5B, in the present embodiment, exposure conditions are set so that the interface (meniscus, edge) LG of the liquid LQ in the immersion space LS is formed between the front surface of the substrate P and the second land surface 29 not only while the substrate P is stationary, but also while it is moved. In the present embodiment, the exposure conditions are set so that the interface LG of the liquid LQ contacts the second land surface 29 even during the movement of the substrate P. The exposure conditions include movement conditions of the substrate P and immersion conditions for forming the immersion space LS. The movement conditions of the substrate P include its moving speed, acceleration, deceleration, distance when moving in one of the prescribed directions (for example, in the +Y direction), and moving direction. The immersion conditions include the amount of liquid LQ supplied per unit of time by the supply port 37. Accordingly, even during the movement of the substrate P, the entire first opening 33 is covered with the liquid LQ in the immersion space LS continuously. Continuously covering the first opening 33 with the liquid LQ makes it possible to prevent, for example, the gas in the gap 15 from mixing in with the liquid LQ in the immersion space LS, as well as the formation of bubbles in the liquid LQ. In addition, by continuously covering the first opening 33 with the liquid LQ, the first opening 33 is disposed on the inner side of the interface LG of the liquid LQ, which makes it possible to suppress disturbances to the state of the interface LG of the liquid LQ as well. In addition, by continuously covering the first opening 33 with the liquid LQ, the liquid LQ of the immersion space LS can flow smoothly into the gap 15 through the first opening 33, and can be recovered by the recovery part 40.

In addition, in the present embodiment, the recovery part 40 is disposed in a surface (in the present embodiment, the inner circumferential surface 25 of the second member 13) that does not oppose the front surface of the substrate P and, through the porous member 30, suctions the liquid LQ that flows into the gap 15 through the first opening 33. Thereby, even if the substrate P moves in the X and Y directions with respect to the immersion space LS, it is possible to prevent, for example, the liquid LQ from leaking or remaining on the front surface of the substrate P (for example, as a film or a drop).

The provision of the recovery part 40 (the porous member 30) in this manner at a position that does not oppose the front surface of the substrate P is based on the following findings of the inventor.

Figure 6A:
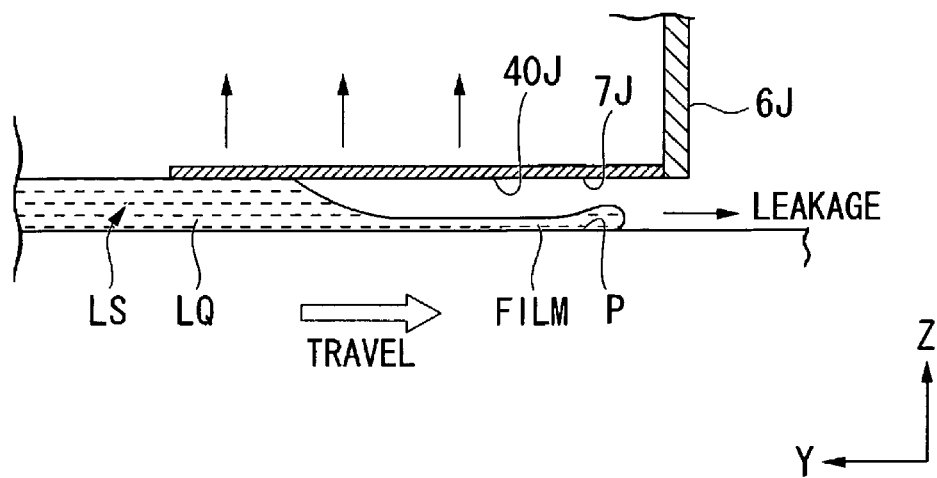
FIG. 6A is a schematic drawing for explaining the action of the immersion member according to the prior art.

FIG. 6A is a schematic drawing that shows the state wherein a recovery part 40J that recovers the liquid LQ of the immersion space LS is disposed in a lower surface 13, which opposes the front surface of the substrate P, of a liquid immersion member 63. If the liquid immersion member 6J is used and the substrate P is moved at high speed in one direction (here, the −Y direction) within the XY plane with respect to the immersion space LS (the liquid immersion member 6J), then there are cases wherein the liquid LQ between the recovery part 40J and the substrate P will form a thin film on the substrate P, or wherein the liquid LQ on the substrate P will leak to the outer side of the recovery part 40J at the outer side of the recovery part 40J, specifically the front side (the −Y side) of the substrate P in its moving direction. This phenomenon occurs because the liquid LQ in the vicinity of the lower surface 7J of the liquid immersion member 6J, i.e., the vicinity of the recovery part 40J, between the lower surface 7J of the liquid immersion member 6J and the front surface of the substrate P flows upward (in the +Z direction) due to the suction operation of the recovery part 40J, and is then recovered by the recovery part 40J, while the liquid LQ in the vicinity of the front surface of the substrate P is not fully recovered by the recovery part 40J as a result of, for example, surface tension with respect to the substrate P, and therefore forms a thin film on the substrate P and, as the substrate P moves, is drawn to the outer side of the recovery part 40J at the front side of the substrate P in its moving direction. If such a phenomenon occurs, then the liquid LQ that is drawn to the outer side of the recovery part 40J forms a drop or the like that remains on the substrate P, which leads to pattern defects and the like. Furthermore, such a phenomenon tends to occur as the moving speed of the substrate P increases, which further clarified the findings of the inventor.

Figure 6B:
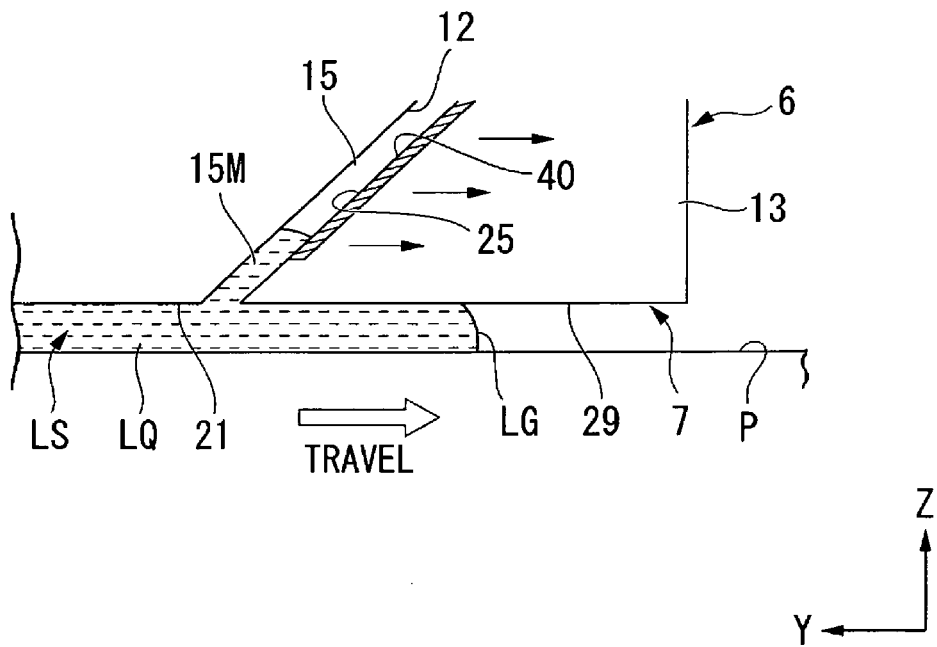
FIG. 6B is a schematic drawing showing the action of the immersion member according to the first embodiment.

FIG. 6B is a schematic drawing that shows the liquid immersion member 6 according to the present embodiment. In the present embodiment, the recovery part 40 is not provided to the lower surface 7, which opposes the front surface of the substrate P, of the liquid immersion member 6 and therefore a strong upward flow of the liquid LQ (in the +Z direction) does not occur in the vicinity of the lower surface 7 of the liquid immersion member 6 (in the vicinity of the first land surface 21 and the second land surface 29). In addition, the gap 15 is in the state wherein it is open to the atmosphere, the flow of the liquid LQ from the first opening 33 into the gap 15 is mainly dependent on the capillary force of the gap 15, and therefore a strong upward flow of the liquid LQ (in the +Z direction) also does not occur in the vicinity of the first opening 33. Accordingly, even if the substrate P moves at high speed in one direction (in the −Y direction) within the XY plane with respect to the immersion space LS (the liquid immersion member 6), the use of the liquid immersion member 6 according to the present embodiment prevents the phenomenon wherein the liquid LQ forms a thin film on the substrate P at the front side (the −Y side) of the substrate P in its moving direction, and the desired state is maintained between the second land surface 29 and the front surface of the substrate P. Namely, even if the substrate P is moved, the liquid LQ between the second land surface 29 and the front surface of the substrate P is prevented from separating from the second land surface 29. Thus, in the present embodiment, the liquid LQ between the second land surface 29 and the front surface of the substrate P contacts the second land surface 29, and therefore the interface LG of the liquid LQ is maintained in the desired state even at the front side (the −Y side) of the substrate P in its moving direction. Accordingly, the liquid LQ is prevented from, for example, leaking to the outer side of the space between the liquid immersion member 6 and the substrate P or remaining on the substrate P (as drops or the like).

According to the present embodiment as explained above, it is possible to recover the liquid LQ satisfactorily and to prevent problems, e.g., the liquid LQ leaking and/or remaining on the front surface of the substrate P attendant with the movement of the substrate P with respect to the immersion space LS; thus, it is possible to prevent exposure failure. In addition, the moving speed of the substrate P can be increased while exposure failure is prevented. Accordingly, satisfactory devices can be fabricated with good productivity.

Second Embodiment

The following explains a second embodiment. In the explanation below, constituent parts that are identical or equivalent to those in the embodiment discussed above are assigned identical symbols, and the explanations thereof are therefore abbreviated or omitted.

Figure 7A:
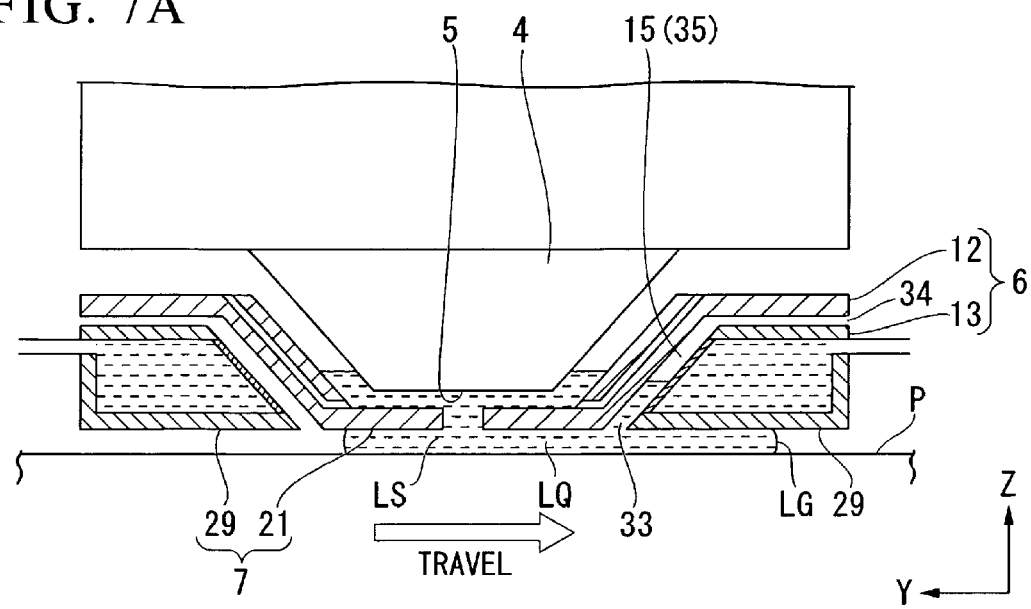
FIG. 7A shows one example of the operation of an exposure apparatus according to a second embodiment.
Figure 7B:
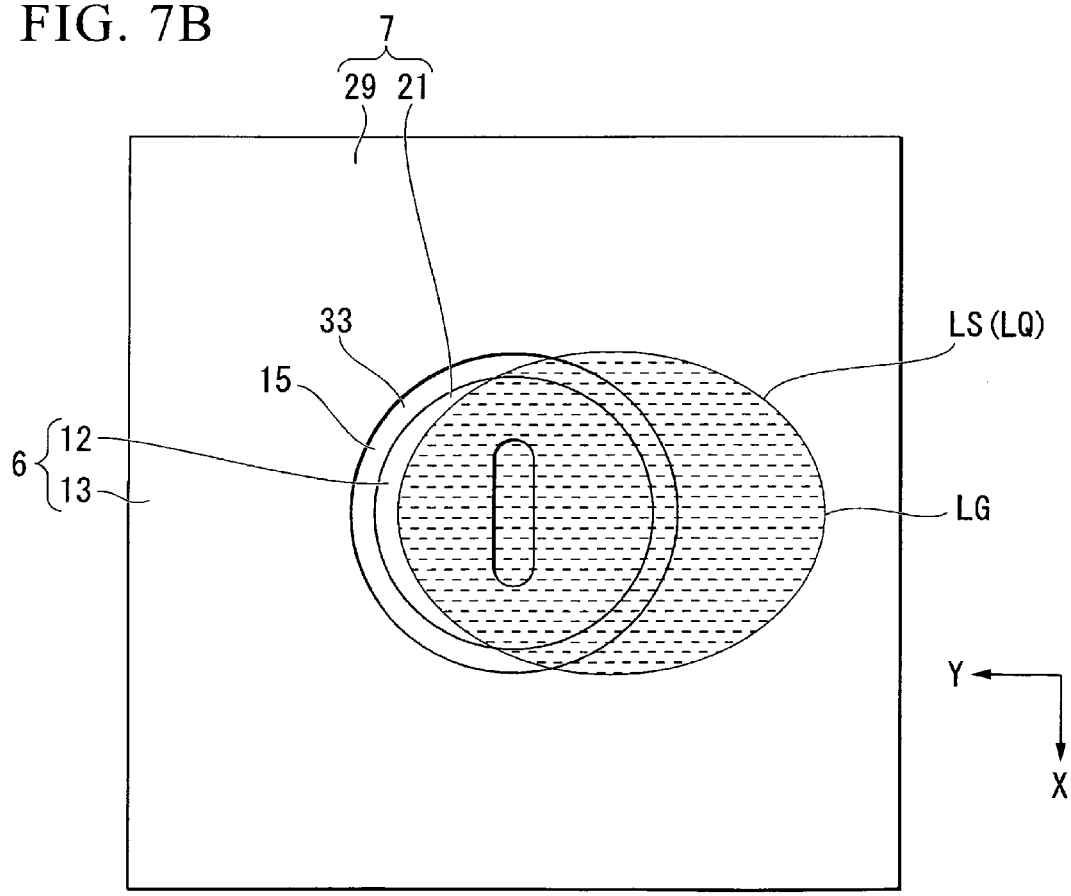
FIG. 7B shows one example of the operation of the exposure apparatus according to the second embodiment.

FIGS. 7A and 7B show a second embodiment and comprises schematic drawings that show a state wherein the front surface of the substrate P moves in the −Y direction with respect to the optical path of the exposure light EL and the immersion space LS; here, FIG. 7A is a side cross sectional view and FIG. 7B shows the liquid immersion member 6 viewed from below. The configuration of the liquid immersion member 6 and the like is equivalent to that of the first embodiment discussed above. The first embodiment discussed above explained an exemplary case wherein the entire first opening 33 is covered with the liquid LQ even during the movement of the substrate P; however, as shown in FIGS. 7A and 7B, part (a portion on the +Y side) of the first opening 33 does not have to be covered with the liquid LQ. The state shown in FIGS. 7A and 7B was discovered by increasing the moving speed of the substrate P in the −Y direction so that it was higher than that of the embodiment shown in FIGS. 5A and 5B.

In the state shown in FIGS. 7A and 7B as well, the state (the shape and the like) of the interface LG of the liquid LQ on the front side (the −Y side) of the substrate P in its moving direction is maintained in a desired state between the second land surface 29 and the front surface of the substrate P. Accordingly, the liquid LQ can be satisfactorily recovered while preventing problems such as the leaking of the liquid LQ at the front side of the substrate P in its moving direction.

As explained in the first embodiment discussed above, also in the present embodiment, the gap 15M in the vicinity of the first opening 33 forms a capillary tube. Accordingly, even if a portion is created at which, attendant with the movement of the substrate P, the first opening 33 does not contact the liquid LQ of the immersion space LS, there is a strong possibility that the liquid LQ will be held by capillary action in the gap (capillary tube) 15M in the vicinity of the first opening 33; furthermore, when the first opening 33 contacts the liquid LQ of the immersion space LS once again, it is possible to prevent the gas in the gap 15 from mixing with the liquid LQ of the immersion space LS and to flow the liquid LQ of the immersion space LS into the gap 15 smoothly.

In addition, as shown in FIGS. 7A and 7B, there is also a possibility that a situation will arise wherein the liquid LQ is not held in part of the gap (capillary tube) 15M in the vicinity of the first opening 33; however, in the present embodiment, the first opening 33 (the gap 15) is annularly provided, which makes it possible to flow the liquid LQ into the gap 15 smoothly using the capillary force of the gap 15M—even if the moving direction of the substrate P changes. For example, even if the substrate P moves in the +Y direction after it has moved in the −Y direction, it is possible to prevent the gas from mixing with the liquid LQ of the immersion space LS and to flow the liquid LQ into the gap (capillary tube) 15M smoothly in the vicinity of a portion of the first opening 33 on the +Y side.

In addition, FIGS. 7A and 7B explained a case wherein the substrate P moves in the −Y direction; however, if the substrate P is moved in any direction within the XY plane, then the liquid LQ on the substrate P continuously contacts the second land surface 29 at the front side of the substrate P in its moving direction without forming a thin film. Accordingly, it is possible to recover the liquid LQ satisfactorily while preventing problems such as the gas mixing in the liquid LQ or the leaking of the liquid LQ.

Third Embodiment

The following explains a third embodiment. The embodiments discussed above explained an exemplary case wherein the first land surface 21 and the second land surface 29 are substantially flush, but they do not have to be parallel.

Figure 8:
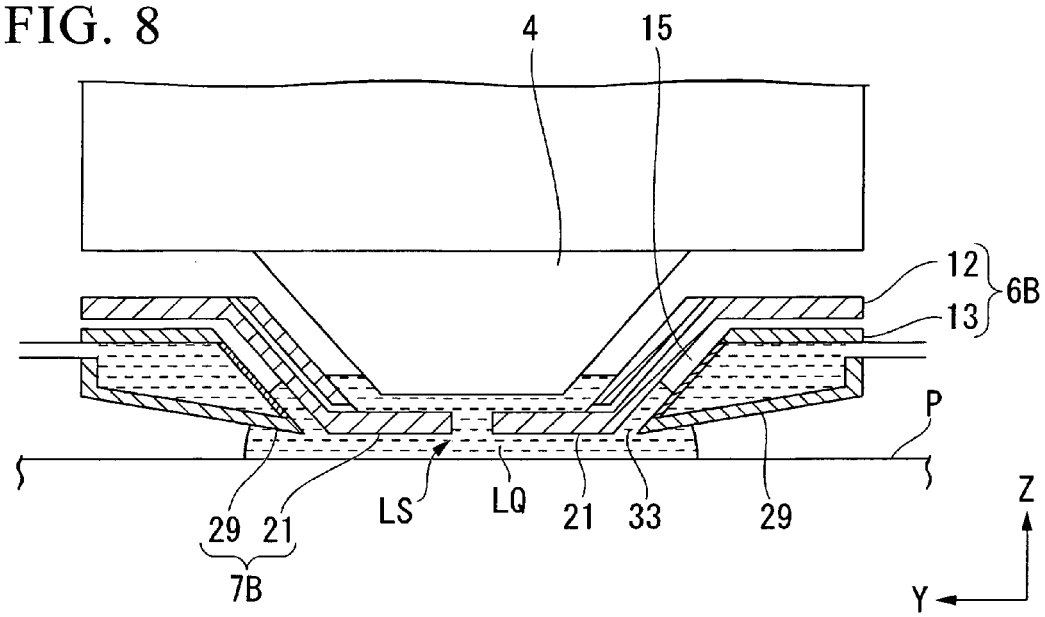
FIG. 8 is a side cross sectional view that shows the vicinity of an immersion member according to a third embodiment.
Figure 9:
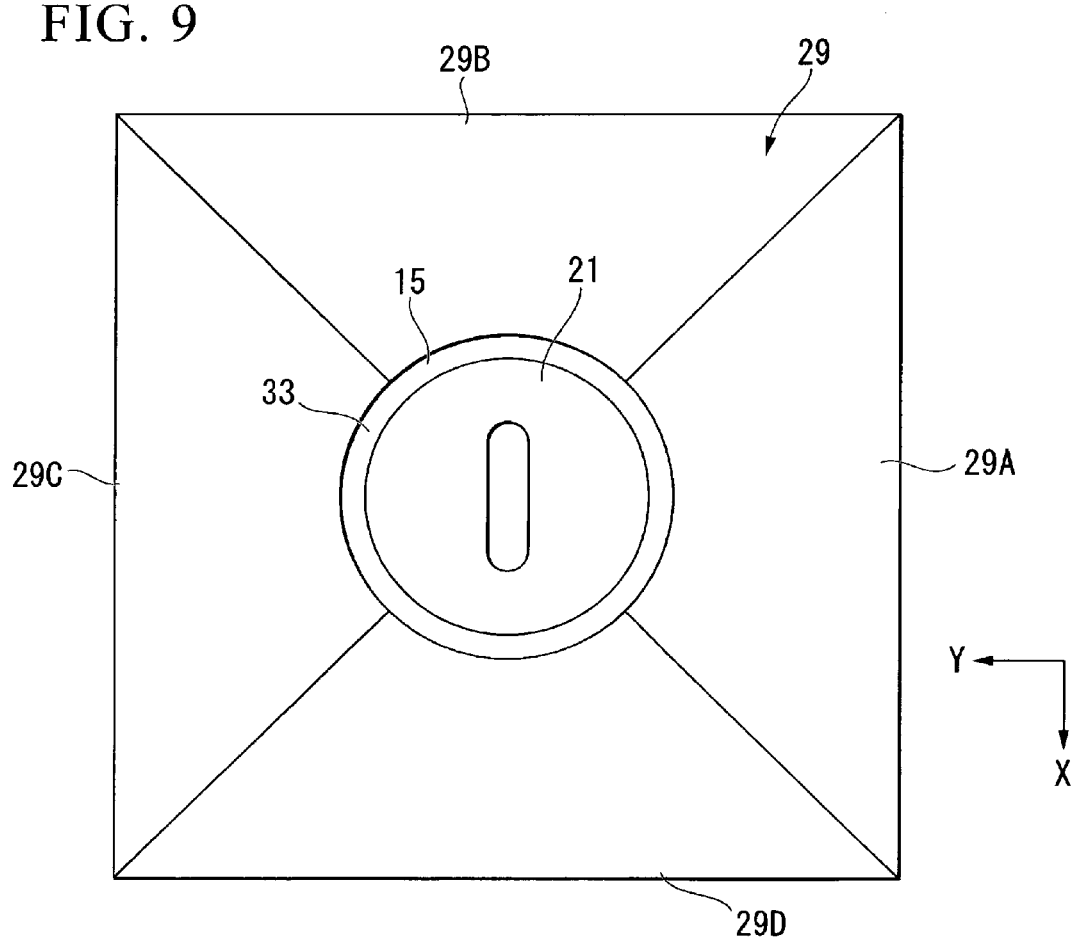
FIG. 9 shows the immersion member according to the third embodiment, viewed from below.

FIG. 8 is a side cross sectional view that shows a liquid immersion member 6B according to the third embodiment, and FIG. 9 is a view of the same, from below. As shown in FIG. 8 and FIG. 9, in the present embodiment, the second land surface 29 is disposed at a position that is spaced apart from the front surface of the substrate P more than the first land surface 21 is. In the present embodiment, the second land surface 29 of the second member 13 is inclined with respect to the first land surface 21 of the first member 12. Specifically, the second land surface 29 is inclined so that the spacing to the front surface of the substrate P increases as it becomes increasingly spaced apart from the optical path of the exposure light EL. The first land surface 21 is substantially parallel to the XY plane (the front surface of the substrate P).

In the present embodiment, the second land surface 29 is formed from four flat surfaces 29A-29D that face four different directions. As shown in FIG. 9, each of the flat surfaces 29A-29D is shaped substantially trapezoidally in a plan view so that it widens as its becomes increasingly spaced from the optical path of the exposure light EL.

Figure 10:
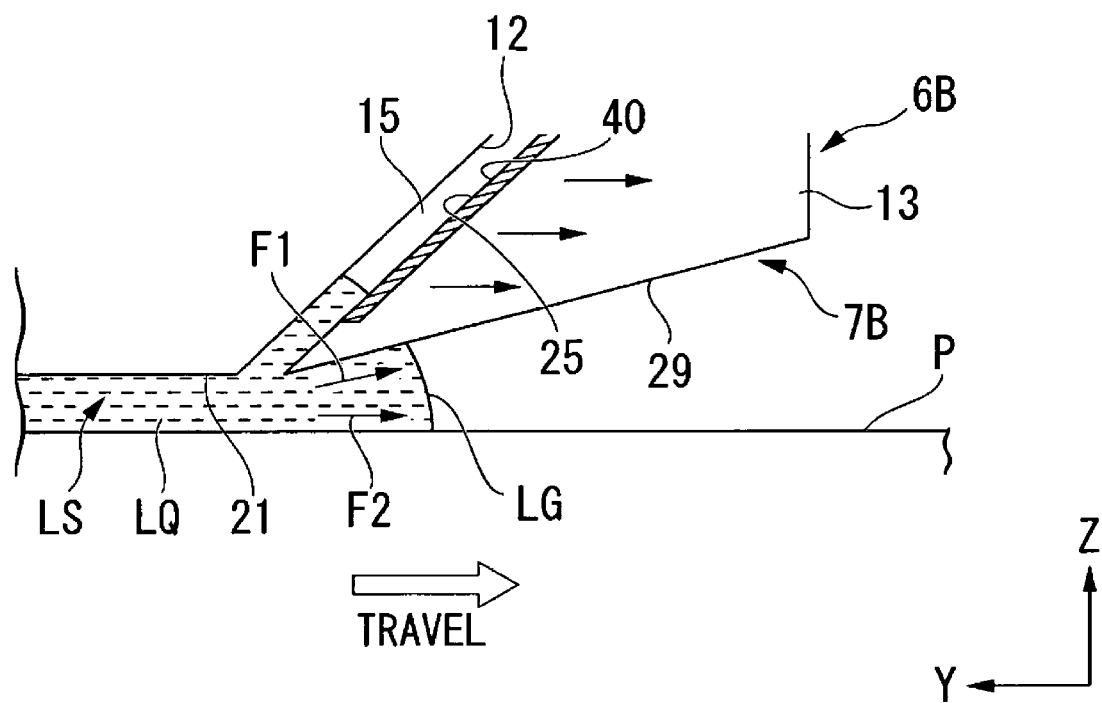
FIG. 10 is a schematic drawing for explaining the action of the immersion member according to the third embodiment.

FIG. 10 shows the state of the immersion space LS when the substrate P has been moved in the −Y direction with respect to the immersion space LS, which is formed using the liquid immersion member 6B according to the third embodiment. In the present embodiment as well, there is no recovery part 40 in a lower surface 7B of the liquid immersion member 6B, and therefore the interface LG of the liquid LQ is maintained in the desired state. In addition, the second land surface 29 is inclined, and therefore a component F1, which moves diagonally upward along the second land surface 29, and a component F2, which moves in a horizontal direction, are generated in the liquid LQ of the immersion space LS. In addition, it is possible to increase the volume of the space between the substrate P and the second land surface 29. Accordingly, it is possible to prevent the enlargement of the immersion space LS. Furthermore, the inclination angle of the second land surface 29 with respect to the XY plane (the first land surface 21) is of course adjusted, e.g., to 2 to 10° so that the liquid LQ between the second land surface 29 and the substrate P does not separate from the second land surface 29.

As explained above, the present embodiment can recover the liquid LQ satisfactorily while preventing the enlargement of the immersion space LS.

Furthermore, in the present embodiment, the second land surface 29 is formed from the four flat surfaces 29A-29D that face different directions, but they may be curved surfaces. Alternatively, the second land surface 29 may be formed by combining five or more flat surfaces.

Fourth Embodiment

Figure 11:
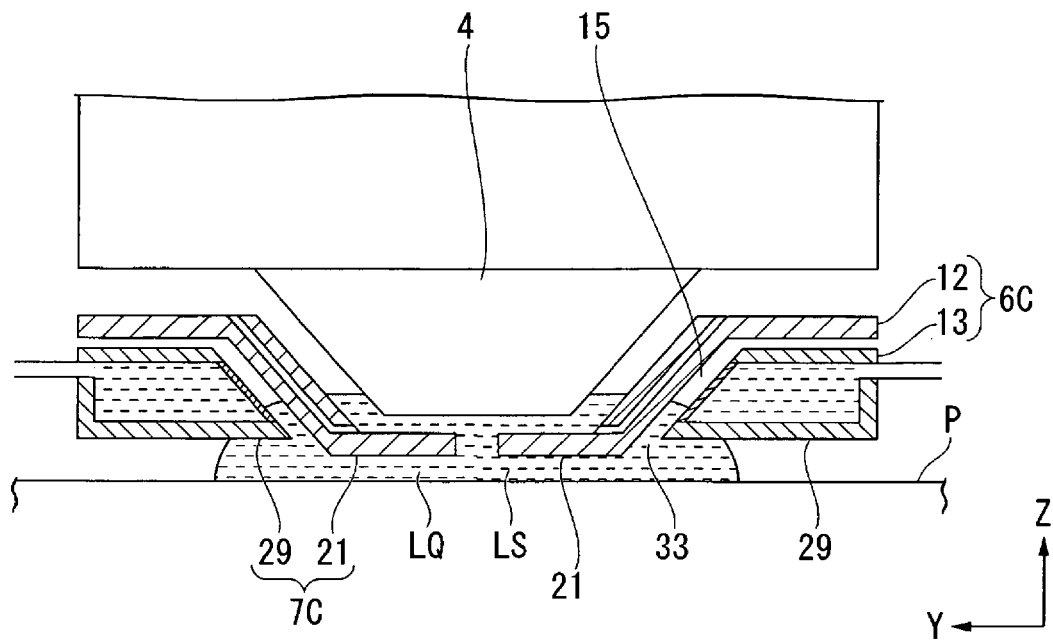
FIG. 11 is a side cross sectional view that shows the vicinity of an immersion member according to a fourth embodiment.

The following explains a fourth embodiment FIG. 11 is a side cross sectional view that shows a liquid immersion member 6C according to the fourth embodiment. In the present embodiment the first land surface 21 of a lower surface 7C of the liquid immersion member 6C and the second land surface 29 are parallel, but they are disposed at different positions with respect to the normal line directions (the Z axial directions) of the front surface of the substrate P. In the present embodiment, the first land surface 21 and the second land surface 29 are both substantially parallel to the XY plane, and the second land surface 29 is disposed at a position that is further spaced apart from the front surface of the substrate P than the first land surface 21 is. In the present embodiment as well, the liquid LQ can be recovered satisfactorily while preventing the enlargement of the immersion space LS. Alternatively, the second land surface 29 can be near the surface of the substrate P than that of the first land surface 21.

Fifth Embodiment

Figure 12:
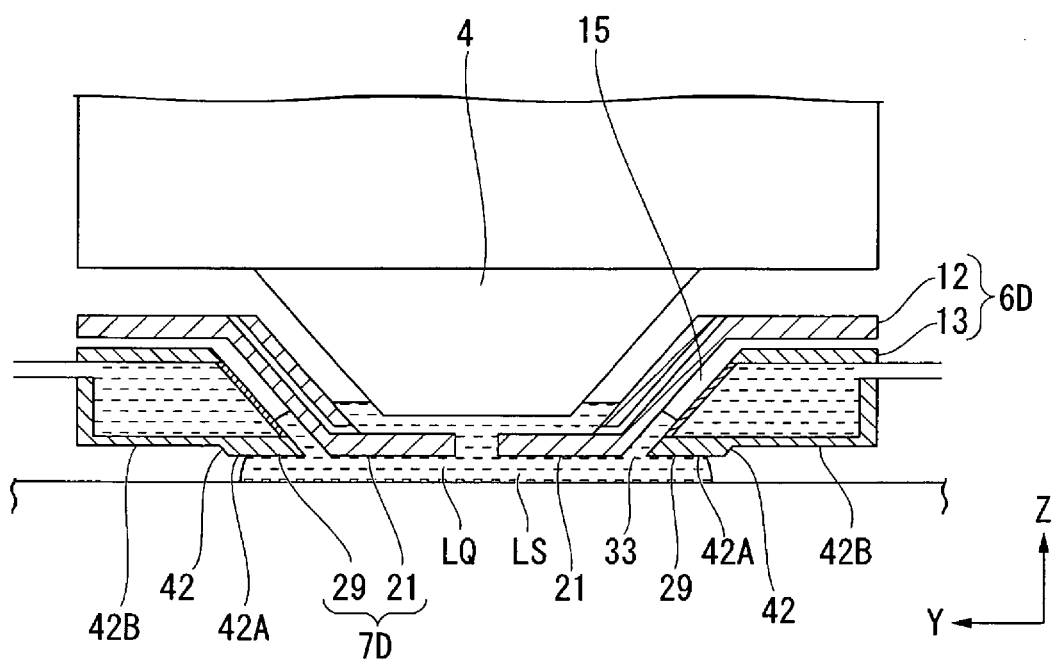
FIG. 12 is a side cross sectional view that shows the vicinity of an immersion member according to a fifth embodiment.

The following explains a fifth embodiment FIG. 12 is a side cross sectional view that shows a liquid immersion member 6D according to the fifth embodiment. In the present embodiment, a step 42 is formed in the second land surface 29 of a lower surface 7D of the liquid immersion member 6D. The first land surface 21 is substantially parallel to the XY plane. A first area 42A of the second land surface 29 on the inner side of the step 42 with respect to the optical path of the exposure light EL is substantially flush with the first land surface 21, and a second area 42B on the outer side of the step 42 with respect to the optical path of the exposure light EL is disposed at a position that is further spaced apart from the front surface of the substrate P than the first area 42A is. In the present embodiment as well, the liquid LQ can be recovered satisfactorily while preventing the enlargement of the immersion space LS. Furthermore, the first area 42A does not have to be flush with the first land surface 21. Alternatively, the second area 42B can be near the surface of the substrate P than that of the first area 42A. In this case, the second area 42B can be near the surface of the substrate P than that of the first land surface 21.

Sixth Embodiment

Figure 13:
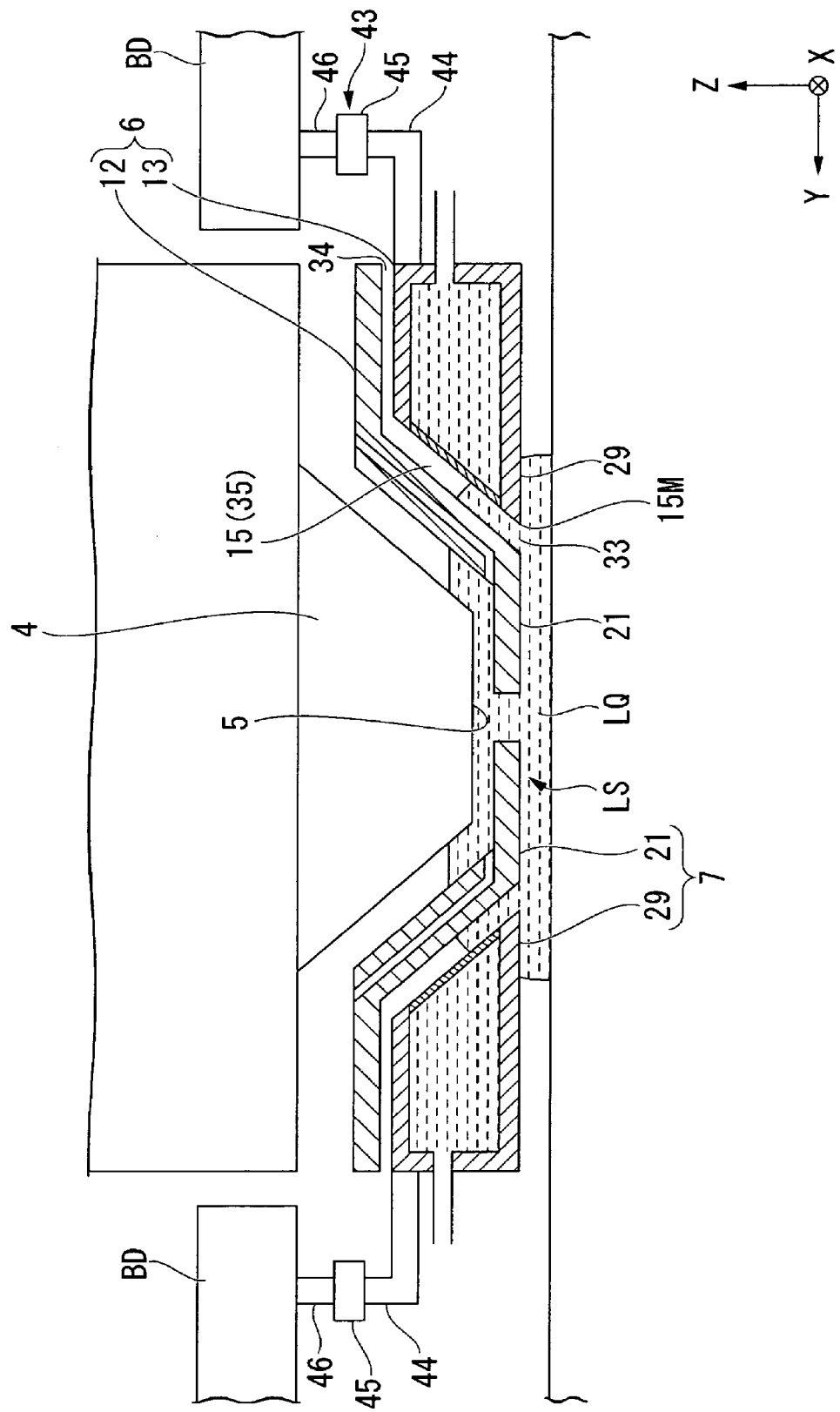
FIG. 13 is a side cross sectional view that shows the vicinity of an immersion member according to a sixth embodiment.

The following explains a sixth embodiment. FIG. 13 is a side cross sectional view of the exposure apparatus EX according to the sixth embodiment. In the present embodiment, the first member 12 and the second member 13 are capable of moving relative to one another. In addition, in the present embodiment, the exposure apparatus EX comprises a drive mechanism 43 mat moves the first member 12 and the second member 13 relative to one another. In the present embodiment, the first member 12 is supported by a support mechanism (not shown), and the position of the first member 12 is fixed by that support mechanism. In the present embodiment, the drive mechanism 43 moves the second member 13. The drive mechanism 43 comprises a connecting member 44, which is connected to the second member 13, an actuator 45, which moves the second member 13 by moving the connecting member 44, and a coupling member 46, which couples the actuator 45 to a support member 6D, e.g., the body of the exposure apparatus EX. The control apparatus 3 uses the drive mechanism 43 to move the second member 13 with respect to the first member 12.

The control apparatus 3 can use the drive mechanism 43 to move the second land surface 29 of the second member 13 to a different position. For example, it is possible to incline the second land surface 29 as shown in FIG. 8 and the like, as well as to make the position of the first land surface 21 and of the second land surface 29 in the Z directions different from one another, as explained in FIG. 11.

In addition, a configuration may be adopted wherein the spacing of the gap 15 (15M) between the first member 12 and the second member 13 is adjusted. Adjusting the spacing of the gap 15 (15M) makes it possible to, for example, adjust the capillary force of the gap 15 (15M) and to adjust the position of the interface of the liquid LQ inside the gap 15, and also makes it possible to flow the liquid LQ into the gap 15 smoothly. In this case, the second member 13 may be divided into a plurality of members.

The control apparatus 3 can move the second member 13 so that the positional relationship between the front surface of the substrate P and the second land surface 29 is adjusted in accordance with, for example, the movement conditions (the moving speed, the moving direction, and the like) of the substrate P, the physical properties of the liquid LQ, and the contact state (the contact angle) of the liquid LQ with respect to the substrate P. In the present embodiment as well, it is possible to prevent, for example, the liquid LQ from leaking or remaining on the front surface of the substrate P.

Furthermore, in the present embodiment, just the second member 13 is moved, but it is possible to move only the first member 12 or to move both.

Seventh Embodiment

Figure 14:
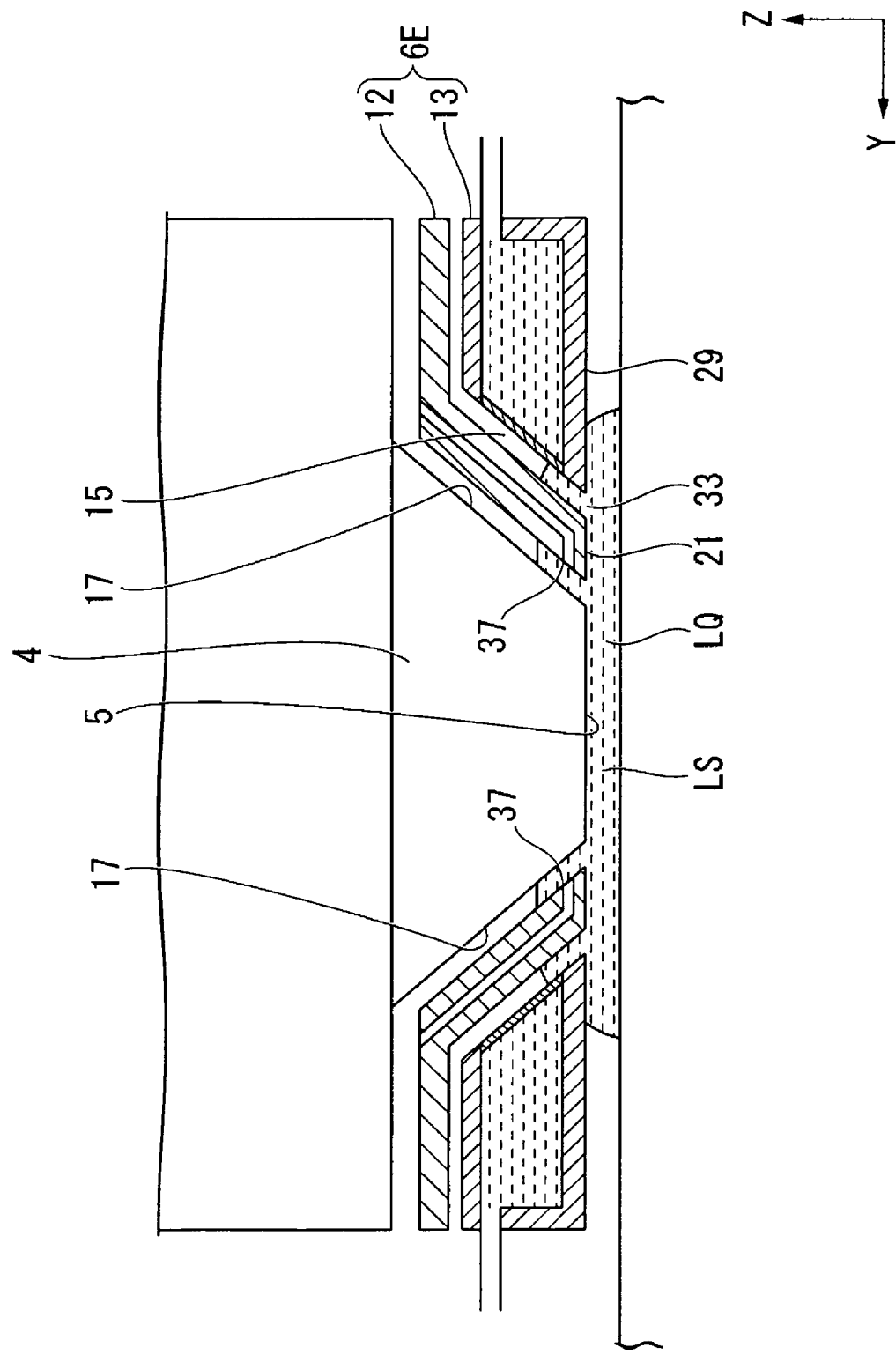
FIG. 14 is a side cross sectional view that shows the vicinity of an immersion member according to a seventh embodiment.

The following explains a seventh embodiment FIG. 14 is a side cross sectional view of an immersion member 6E abiding to the seventh embodiment. Each of the embodiments discussed above explained an exemplary case wherein at least part of the lower plate part 12A of the first member 12 is disposed between the lower surface 5 of the last optical element 4 and the front surface of the substrate P, but the lower plate part of the first member 12 may be omitted, as shown in FIG. 14. In addition, in FIG. 14, the lower surface 5 of the last optical element 4, the first land surface 21 of the first member 12, and the second land surface 29 of the second member 13 are substantially flush with one another. Each of the supply ports 37 is disposed at a position mat opposes the outer circumferential surface 17 of the last optical element 4, and supplies the liquid LQ toward the outer circumferential surface 17. In the present embodiment as well, the liquid LQ can be recovered satisfactorily. Furthermore, the lower surface 5 of the last optical element 4, the first land surface 21 of the first member 12, and the second land surface 29 of the second member 13 do not have to be flush with one another.

Furthermore, each of the embodiments discussed above explained an exemplary case wherein the liquid immersion member 6 comprises a first member 12 and a second member 13, which is different from the first member 12, but the liquid immersion member 6 may be formed from a single member. In this case, a liquid immersion member 6 that is formed from a single member comprises the first opening 33, the second opening 34, the gap 35, the first laud surface 21, and the second land surface 29.

Figure 15:
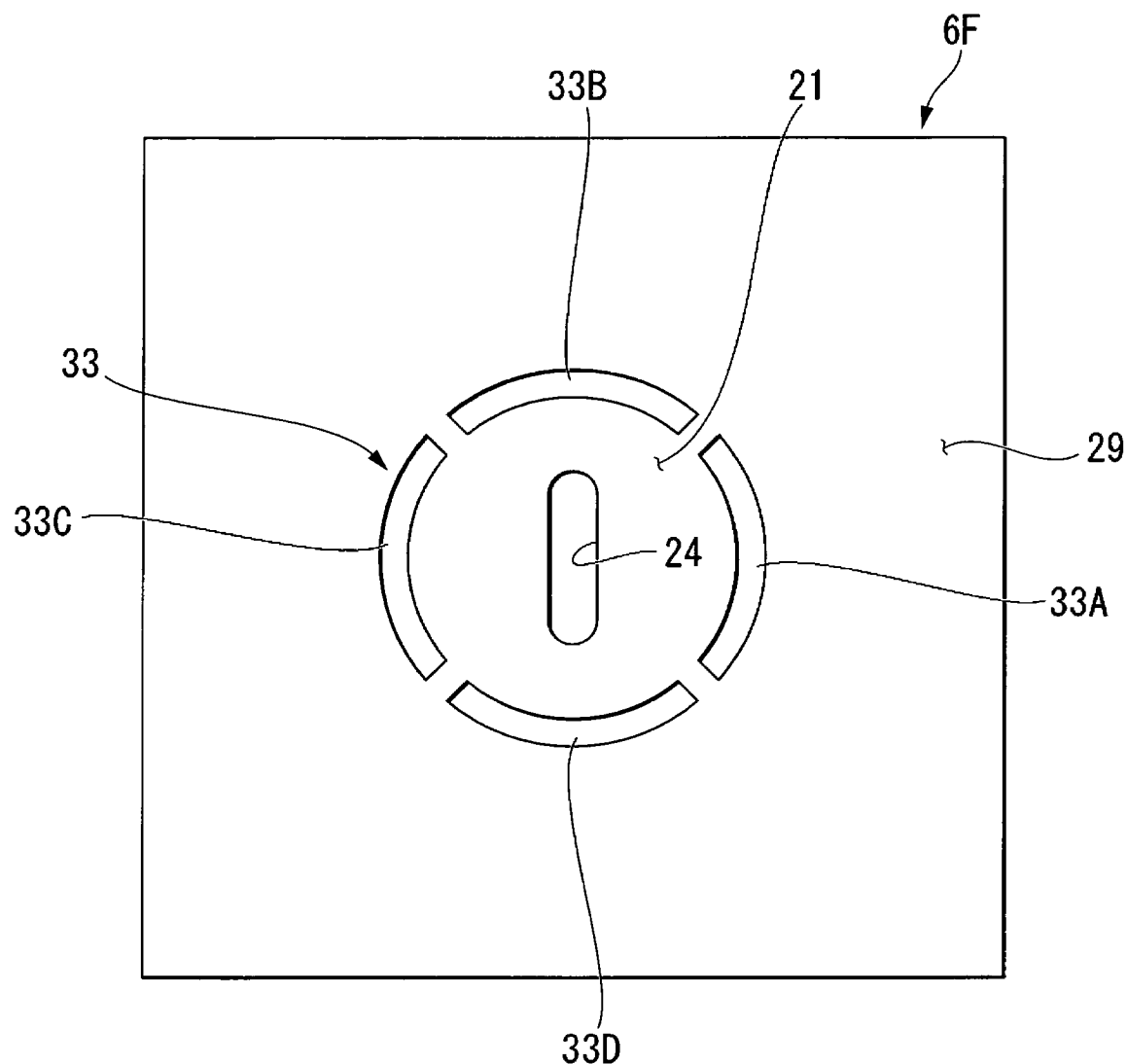
FIG. 15 shows an immersion member according to another embodiment, viewed from below.

In addition, as shown in FIG. 15, the annular first opening 33 of a liquid immersion member 6F may be divided into multiple openings. In this case, as shown in FIG. 15, the multiple first openings 33 may be provided so that they are distributed in the circumferential directions. The first opening 33 shown in FIG. 15 is formed from four slits 33A-33D that are arcuately formed within the XY plane. The slits 33A-33D are disposed on opposite sides of the substrate P in the scanning directions (the Y axial directions) and on opposite sides of the substrate P in the non-scanning directions (the X axial directions) with respect to the optical path of the exposure light EL.

In addition, in the first through seventh embodiments discussed above, the recovery part 40 of the second member 13 is provided annularly, but the annular recovery part 40 may be divided into multiple parts. In this case, the multiple recovery parts 40 may be disposed so that they are distributed in the circumferential directions.

In the each of the embodiments discussed above, the supply port(s) 37 can alternatively be provided so as to face the −Z direction (i.e., to be oriented along the −Z direction). In other words, the supply port(s) can be provided on the lower surface 21 of the first member 12.

In the each of the embodiments discussed above, the surface (the first surface) of the porous member 30 is inclinedly disposed so as to face the +Z direction (i.e., to be upwardly inclined). In another embodiment, the surface (the first surface) of the porous member 30 can be disposed substantially parallel to the Z directions and facing the optical path of the exposure light EL. Alternatively, the surface (the first surface) of the porous member 30 can be disposed substantially parallel to the XY plane and facing the +Z direction. In this case, the liquid LQ, which has been drawn in the gap 31 between the upper plate part 12c of the first member 12 and the second member 13 by the capillary force, can be recovered via the porous member 30.

Furthermore, in the first through seventh embodiments discussed above, the optical path space on the emergent side (the image plane side) of the last optical element 4 of the projection optical system PL is filled with the liquid LQ, but it is also possible to employ a projection optical system wherein the optical path space on the incident side (the object plane side) of the last optical element 4 is also filled with the liquid LQ, as disclosed in PCT International Publication No. WO2004/019128.

Furthermore, although the liquid LQ in the embodiments discussed above is water, it may be a liquid other than water. It is preferable to use a liquid as the liquid LQ that is transparent to the exposure light EL, has as high a refractive index as possible, and is stable with respect to the projection optical system PL or the film of the photosensitive material (the photoresist) mat forms the front surface of the substrate P. For example, it is possible to use hydro-fluoro-ether (HFE), perfluorinated polyether (PFPE), Fomblin oil, cedar oil, or the like as the liquid LQ. In addition, a liquid that has a refractive index of approximately 1.6 to 1.8 may be used as the liquid LQ. Furthermore, the optical element (the last optical element 4 or the like) of the projection optical system PL that contacts the liquid LQ may for example be formed from quartz (silica), or from fluorite, barium fluoride, strontium fluoride, lithium fluoride, sodium fluoride, or single-crystal materials of other fluoride compounds. Furthermore, the terminus optical element may be formed from materials with a refractive index higher than that of quartz or fluorite (for example 1.6 or higher). As materials with a refractive index of 1.6 or higher, for example, sapphire, germanium dioxide or similar disclosed in PCT International Publication No. WO 2005/059617, or potassium chloride (with a refractive index of approximately 1.75) disclosed in PCT International Publication No. WO 2005/059618, or similar can be used. Furthermore, a thin film having liquid affinity properties and/or a dissolution-preventing function may be formed on a portion of (including at least the contact faces with the liquid) or the entirety of the terminus optical element Quartz has high affinity to liquid and thus a dissolution preventive film is not necessary therefor. However, as for fluorite, it is preferable that at least a dissolution preventive film be formed thereon. In addition, it is also possible to use various fluids, e.g., a supercritical fluid, as the liquid LQ. As a liquid with refractive index higher than pure water (for example 1.5 or higher), for example isopropanol with a refractive index of approximately 1.50, glycerol (glycerin) with a refractive index of approximately 1.61, and other prescribed liquids having C—H bonds or O—H bonds, as well as hexane, heptane, decane, and other prescribed liquids (organic solvents), as well as decalin (decahydronaphthalene) with a refractive index of approximately 1.60, may be used. Further, as the liquid two or more arbitrary liquids among these liquids may be mixed together and used, or one or more of these liquids may be added to (mixed with) pure water and used. Further, as the liquid, pure water to which $H^+$, $Cs^+$, $K^+$, $Cl^-$, $SO_4^{2-}$, $PO_4^{2-}$, or other bases or acids are added (mixed) may be used, or pure water to which an Al oxide or other fine particles have been added (mixed) may be used. Also, as the liquid, it is preferable that a liquid be used which has a low optical absorption coefficient, a small temperature dependence, and which is stable with respect to photosensitive materials (or topcoat films, or anti-reflection films, or similar) applied to the surfaces of the projection optical system and/or substrate. In addition, a topcoat film or similar can be provided on the substrate to protect photosensitive materials or substrates from the liquid.

In addition, if, for example, $F_2$ laser light is used as the exposure light EL, then it will not transmit through water; in this case, a fluid that can transmit the $F_2$ laser light can be used as the liquid LQ, e.g., a fluorine based fluid such as perfluoropolyether (PFPE) or a fluorine based oil. In this case, the parts that contact the liquid LQ are made to have liquid affinity by forming a thin film with, for example, a substance that has a molecular structure that contains fluorine and has low polarity.

Furthermore, the substrate P in each of the embodiments discussed above is not limited to a semiconductor wafer for fabricating semiconductor devices, but can also be, for example, a glass substrate for display devices, a ceramic wafer for thin film magnetic heads, or a mask or the original plate of a reticle (synthetic quartz or a silicon wafer), film member, and similar used by an exposure apparatus. Moreover, substrates are not limited to round shape, but may be rectangular or other shapes.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

Furthermore, when performing an exposure with a step-and-repeat system, the projection optical system is used to transfer a reduced image of a first pattern onto the substrate P in a state wherein the first pattern and the substrate P are substantially stationary, after which the projection optical system may be used to perform full-field exposure of the substrate P, wherein a reduced image of a second pattern partially superposes the transferred first pattern (as in a stitching type full-field exposure apparatus) in a state wherein the second pattern and the substrate P are substantially stationary. In addition, the stitching type exposure apparatus can also be adapted to a step-and-stitch type exposure apparatus that transfers at least two patterns onto the substrate P so that they partially overlap, and sequentially steps the substrate P.

In addition, the present invention can also be adapted to, for example, an exposure apparatus that combines the patterns of two masks on a substrate through a projection optical system, and double exposes, substantially simultaneously, a single shot region on the substrate using a single scanning exposure, as disclosed in, for example, Published Japanese Translation No. 2004-519850 of the PCT International Publication (corresponding U.S. Pat. No. 6,611,316). In addition, the present invention can also be adapted to, for example, a proximity type exposure apparatus and a mirror projection aligner.

In addition, the present invention can also be adapted to a twin stage type exposure apparatus that is provided with a plurality of substrate stages, as disclosed in, for example, Japanese Patent Application, Publication No. H10-163099A, Japanese Patent Application, Publication No. H10-214783A, Published Japanese Translation No. 2000-505958 of the PCT International Publication, U.S. Pat. Nos. 6,341,007, 6,400,441, 6,549,269, 6,590,634, 6,208,407, and 6,262,796.

Furthermore, the present invention can also be adapted to an exposure apparatus that is provided with a substrate stage that holds a substrate and a measurement stage whereon various photoelectric sensors and/or a fiducial member, wherein a fiducial mark is formed, are installed, as disclosed in, for example, Japanese Patent Application, Publication No. H11-135400, and Japanese Patent Application, Publication No. 2000-164504A (corresponding U.S. Pat. No. 6,897,963). In addition, the present invention can also be adapted to an exposure apparatus that comprises a plurality of substrate stages and measurement stages.

The type of exposure apparatus EX is not limited to a semiconductor device fabrication exposure apparatus that exposes the substrate P with the pattern of a semiconductor device, but can also be widely adapted to exposure apparatuses that are used for fabricating, for example, liquid crystal devices or displays, and to exposure apparatuses that are used for fabricating thin film magnetic heads, image capturing devices (CCDs), micromachines, MEMS, DNA chips, or reticles and masks.

Furthermore, in each of the embodiments discussed above, the positional information of the mask stage 1 and the substrate stage 2 is measured using an interferometer system that comprises the laser interferometers 1S, 2S, but the present invention is not limited thereto and, for example, an encoder system may be used that detects a scale (diffraction grating) that is provided to each of the stages 1, 2. In this case, the system is preferably configured as a hybrid system that is provided with both an interferometer system and an encoder system, and it is preferable to use the measurement results of the interferometer system to calibrate the measurement results of the encoder system. In addition, the position of the stages may be controlled by switching between the interferometer system and the encoder system, or by using both.

In addition, in each of the embodiments discussed above, an ArF excimer laser may be used as a light source apparatus that generates ArF excimer laser light, which serves as the exposure light EL; however, as disclosed in, for example, PCT International Publication No. WO1999/46835 (corresponding U.S. Pat. No. 7,023,610), a harmonic generation apparatus may be used that outputs pulsed tight with a wavelength of 193 nm and that comprises: an optical amplifier part, which has a solid state laser light source (such as a DFB semiconductor laser or a fiber laser), a fiber amplifier, and the like; and a wavelength converting part. Furthermore, in the abovementioned embodiments, each illumination area and the projection area are rectangular, but they may be some other shape, e.g., arcuate.

Furthermore, in each of the embodiments discussed above, a light transmitting type mask is used wherein a prescribed shielding pattern (or a phase pattern or a dimming pattern) is formed on a light transmitting substrate; however, instead of such a mask, a variable forming mask (also called an electronic mask, an active mask, or an image generator), wherein a transmittance pattern, a reflected pattern, or a light emitting pattern is formed based on electronic data of the pattern to be exposed, may be used as disclosed in, for example, U.S. Pat. No. 6,778,257. The variable forming mask comprises a DMD (digital micro mirror device), which is one kind of non-emissive type image display device (also called a Spatial Light Modulator (SLM)). The exposure apparatus using a DMD is disclosed for example in U.S. Pat. No. 6,778,257. In addition, the variable forming mask is not limited to a DMD, and instead a non-emissive type image display device, which is explained below, may be used. Here, the non-emissive type image display device is a device that spatially modulates the amplitude (the intensity), the phase, or the polarization state of the light that travels in a prescribed direction; furthermore, examples of a transmissive type spatial light modulator include a transmissive type liquid crystal display (LCD) device as well as an electrochromic display (ECD). In addition, examples of a reflecting type spatial light modulator include a DMD, which was discussed above, as well as a reflecting mirror array, a reflecting type liquid crystal display device, an electrophoretic display (EPD), electronic paper (or electronic ink), and a grating light valve.

In addition, instead of a variable forming mask that is provided with a non-emissive type image display device, a pattern forming apparatus that comprises a self luminous type image display device may be provided. In this case, the illumination system is unneeded. Here, examples of a self luminous type image display device include a CRT (cathode ray tube), an inorganic electroluminescence display, an organic electroluminescence display (OLED: organic light emitting diode), an LED display, an LD display, a field emission display (FED), and a plasma display (PDP: plasma display panel). In addition, a solid state light source device that has a plurality of light emitting points, a solid state light source chip array wherein a plurality of chips are arrayed, a solid state light source device that creates a plurality of light emitting points on a single substrate, or the like may be used as the self luminous type image display device that is provided with the pattern forming apparatus, and the pattern may be formed by electrically controlling the solid state light source chip(s). Furthermore, it does not matter whether the solid state light source device is inorganic or organic.

Each of the embodiments discussed above explained an exemplary case of an exposure apparatus that is provided with the projection optical system PL, but the present invention can be adapted to an exposure apparatus and an exposing method that do not use the projection optical system PL. Even if the projection optical system PL is not used, the exposure light is radiated onto the substrate through optical members, e.g. lenses, and an immersion space is formed in a prescribed space between the substrate and those optical members.

In addition, by forming interference fringes on the substrate P as disclosed in, for example, PCT International Publication No. WO2001/035168, the present invention can also be adapted to an exposure apparatus (a lithographic system) that exposes the substrate P with a line-and-space pattern.

As far as is permitted, each disclosure of every Japanese published patent application and U.S. patent related to the exposure apparatus recited in each of the embodiments discussed above, modified examples, and the like is hereby incorporated by reference.

As described above, the exposure apparatus EX of the embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 16:
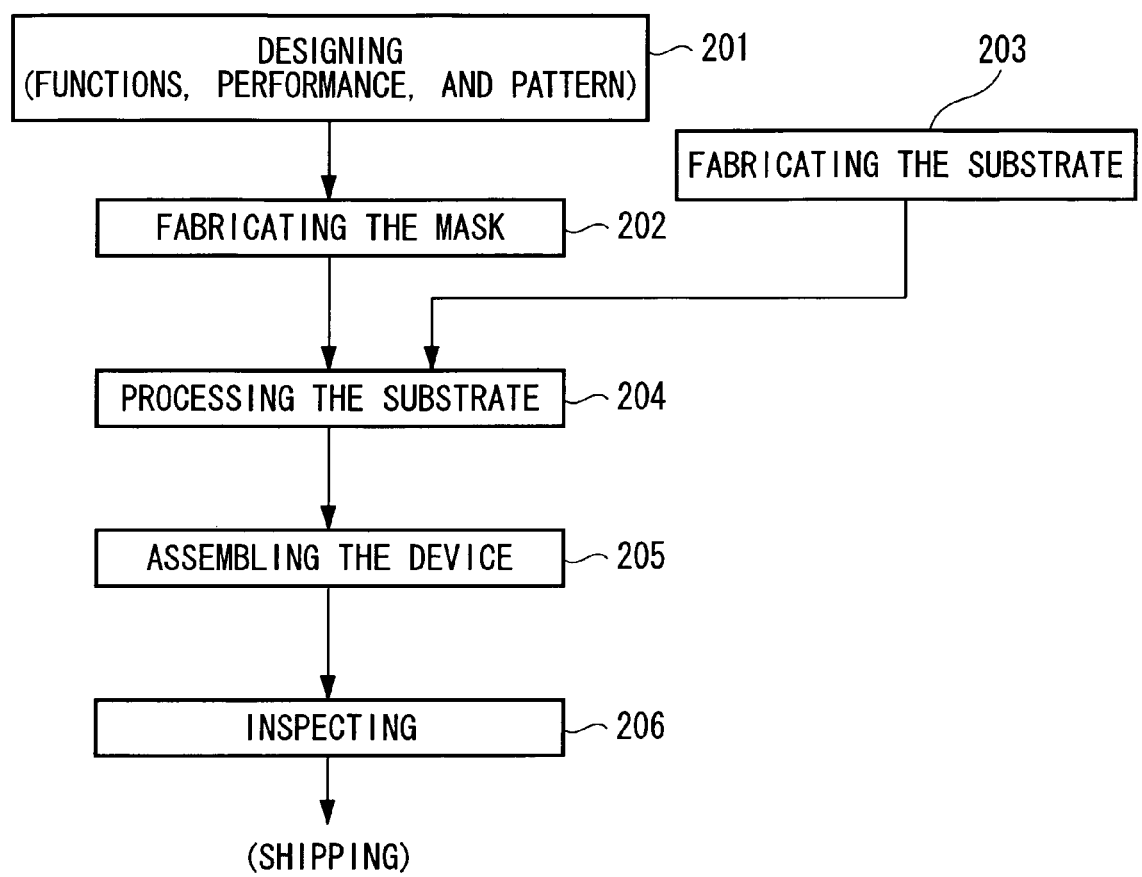
FIG. 16 is a flow chart diagram that shows one example of a process of fabricating a microdevice.

As shown in FIG. 16, a micro-device, such as a semiconductor device, is manufactured by: a step 201 that designs me functions and performance of the micro-device; a step 202 that fabricates a mask (a reticle) based on this design step; a step 203 that fabricates a substrate, which is the base material of the device; a substrate processing step 204 that comprises a substrate process (exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

What is claimed is:

1. A liquid recovery system that is used by a liquid immersion exposure apparatus in which an exposure light is projected onto a substrate, comprising:
    a first opening arranged to surround an aperture through which the exposure beam is projected onto the substrate;
    a gap portion into which, through the first opening, a liquid on an object that opposes the first opening flows;
    a liquid recovery part that suctions, through a porous member, at least part of the liquid in the gap portion into a recovery channel, a gas in the gap portion being prevented from flowing into the recovery channel through the porous member; and
    a second opening, that is different from the first opening, through which the gas in the gap portion is discharged and not through the first opening.

2. A liquid recovery system according to claim 1, wherein the first opening is shaped annular, and
    the gap portion is shaped annular along the first opening.

3. A liquid recovery system according to claim 2, wherein the liquid recovery part is annularly provided along the gap portion.

4. A liquid recovery system according to claim 1, further comprising:
    a first member; and
    a second member that is different from the first member;
    wherein,
    the first opening, the second opening, and the gap portion are each provided between the first member and the second member.

5. A liquid recovery system according to claim 4, wherein the first member comprises a first portion;
    the second member comprises a second portion;
    the first member and the second member are disposed so that the first portion and the second portion oppose each other;
    the gap portion is formed between the first portion and the second portion; and
    the liquid recovery part is provided to the second portion.

6. A liquid recovery system according to claim 5, wherein the porous member is disposed in the second portion, which opposes the first portion.

7. A liquid recovery system according to claim 4, wherein the first member comprises a liquid supply port.

8. A liquid recovery system according to claim 4, wherein the first member and the second member are movable relative to one another.

9. A liquid recovery system according to claim 4, wherein the second member comprises the recovery channel in which the liquid from the gap and through from the porous member flows.

10. A liquid recovery system according to claim 1, wherein the gap portion forms a capillary passage into which the liquid on the object that opposes the first opening can flow.

11. An immersion exposure apparatus that exposes a substrate, comprising:
    an optical member, which comprises an emergent surface that emits exposure light; and
    an aperture through which the exposure light from the emergent surface is projected onto the substrate;
    a liquid recovery system that comprises:
        a first opening arranged to surround the aperture;
        a second opening that is different from the first opening;
        a gap portion into which, through the first opening, a liquid on an object that opposes the first opening flows; and
        a liquid recovery part that suctions at least part of the liquid in the gap portion, wherein:
        a gas in the gap portion is prevented from flowing into a recovery channel through the liquid recovery part; and
        the gas in the gap portion can be discharged through the second opening and not through the first opening.

12. An immersion exposure apparatus according to claim 11, wherein
    the object is capable of moving to a position that opposes the emergent surface of the optical member.

13. An immersion exposure apparatus according to claim 12, wherein
    the object comprises the substrate; and
    the exposure light is radiated to the substrate through the liquid on the substrate.

14. An immersion exposure apparatus according to claim 11, wherein:
    the liquid recovery system further comprises a first member and a second member that is different from the first member; and
    the first opening, the second opening, and the gap portion are each provided between the first member and the second member.

15. An immersion exposure apparatus according to claim 14, wherein
    the first member comprises a first portion;
    the second member comprises a second portion;
    the first member and the second member are disposed so that the first portion and the second portion oppose each other,
    the gap portion is formed between the first portion and the second portion; and
    the liquid recovery part is provided to the second portion.

16. An immersion exposure apparatus according to claim 15, wherein
    the liquid recovery part includes a porous member disposed in the second portion, which opposes the first portion.

17. An immersion exposure apparatus according to claim 14, wherein
    the first member is provided in a vicinity of the optical member so that it surrounds the optical path of the exposure light; and the second member is provided on an outer side of the first member with respect to the optical path of the exposure light so that it surrounds the first member with the gap portion interposed therebetween.

18. An immersion exposure apparatus according to claim 17, wherein
the first opening and the gap portion are shaped annular.

19. An immersion exposure apparatus according to claim 18, wherein
the liquid recovery part is shaped annular along the gap portion.

20. An immersion exposure apparatus according to claim 17, wherein
the second member comprises a liquid contact surface on an outer side of the first opening with respect to the optical path of the exposure light; and
part of the liquid on the object is held between the object and the liquid contact surface.

21. An immersion exposure apparatus according to claim 20, wherein
the first member comprises a liquid contact surface on an inner side of the first opening with respect to the optical path of the exposure light; and
part of the liquid on the object is held between the object and the liquid contact surface.

22. An immersion exposure apparatus according to claim 21, wherein
the liquid contact surface of the second member is inclined with respect to the liquid contact surface of the first member.

23. An immersion exposure apparatus according to claim 14, wherein
the first member comprises a liquid supply port.

24. An immersion exposure apparatus according to claim 14, wherein
the second member comprises the recovery channel in which the liquid from the gap and through from the liquid recovery part flows.

25. An immersion exposure apparatus according to claim 14, wherein
the first member and the second member are relatively movable.

26. An immersion exposure apparatus according to claim 11, wherein
the gap portion forms a capillary passage into which the liquid on the object that opposes the first opening can flow.

27. A device fabricating method, comprising:
exposing a substrate using an immersion exposure apparatus according to claim 11; and
developing the exposed substrate.

28. An immersion exposing method that exposes a substrate, comprising:
exposing the substrate with exposure light through a liquid on the substrate; and
recovering the liquid on the substrate using a liquid recovery system according to claim 1, during the exposure of the substrate.

29. A device fabricating method, comprising:
exposing a substrate using an exposing method according to claim 28; and
developing the exposed substrate.

30. A liquid recovery system according to claim 1, wherein the second opening is disposed such that the liquid does not come into contact with the second opening.

31. A liquid recovery system according to claim 1, wherein the second opening is disposed above the first opening.

32. A liquid recovery system according to claim 31, wherein the second opening is disposed above the porous member.

33. A liquid recovery system according to claim 32, wherein the second opening is disposed further away from an optical path of the exposure light than the porous member.

34. An immersion exposure apparatus according to claim 11, wherein the second opening is disposed such that the liquid does not come into contact with the second opening.

35. An immersion exposure apparatus according to claim 11, wherein the second opening is disposed above the first opening.

36. An immersion exposure apparatus according to claim 35, wherein the second opening is disposed above the liquid recovery part.

37. An immersion exposure apparatus according to claim 36, wherein the second opening is disposed further away from an optical path of the exposure light than the liquid recovery part.

* * * * *